United States Patent
Wakamatsu et al.

(10) Patent No.: US 10,180,623 B2
(45) Date of Patent: Jan. 15, 2019

(54) NANOIMPRINTING METHOD, AND METHOD FOR PRODUCING A DROPLET ARRANGEMENT PATTERN

(71) Applicant: FUJIFILM Corporation, Tokyo (JP)

(72) Inventors: Satoshi Wakamatsu, Kanagawa-ken (JP); Tadashi Omatsu, Kanagawa-ken (JP)

(73) Assignee: FUJIFILM Corporation, Tokyo (JP)

(*) Notice: Subject to any disclaimer, the term of this patent is extended or adjusted under 35 U.S.C. 154(b) by 19 days.

(21) Appl. No.: 15/666,695

(22) Filed: Aug. 2, 2017

(65) Prior Publication Data
US 2017/0363955 A1   Dec. 21, 2017

Related U.S. Application Data

(62) Division of application No. 13/638,839, filed as application No. PCT/JP2011/058654 on Mar. 30, 2011, now abandoned.

(Continued)

(30) Foreign Application Priority Data

Mar. 30, 2010 (JP) .................... 2010-079085
Sep. 29, 2010 (JP) .................... 2010-218222

(51) Int. Cl.
  *G03F 7/00*   (2006.01)
  *B41J 2/21*   (2006.01)
  (Continued)

(52) U.S. Cl.
  CPC .......... *G03F 7/0002* (2013.01); *B41J 2/2135* (2013.01); *B82Y 10/00* (2013.01); *B82Y 40/00* (2013.01); *G11B 5/855* (2013.01)

(58) Field of Classification Search
  None
  See application file for complete search history.

(56) References Cited

U.S. PATENT DOCUMENTS

2005/0106321 A1   5/2005  McMackin et al.
2005/0270312 A1   12/2005 Lad et al.
(Continued)

FOREIGN PATENT DOCUMENTS

JP   2008-502157   1/2008
JP   2008-042187   2/2008
(Continued)

OTHER PUBLICATIONS

International Search Report, PCT/JP2011/058654, dated Jul. 19, 2011.
(Continued)

*Primary Examiner* — Michael P. Rodriguez
(74) *Attorney, Agent, or Firm* — Young & Thompson

(57) ABSTRACT

The disclosed nanoimprinting method suppresses fluctuations in thickness of residual film and defects due to residual gas in a resist film, onto which a pattern of protrusions and recesses is transferred, in a nanoimprinting method that employs the ink jet method to coat a substrate with droplets of resist material. Droplets are coated onto a substrate such that the spaces between the droplets along an A direction which is substantially parallel to the direction of the lines of a linear pattern of protrusions and recesses are longer than the spaces between the droplets in a B direction which is substantially perpendicular to the A direction, in a nanoimprinting method that coats a substrate with the droplets of a resist material using the ink jet method.

6 Claims, 10 Drawing Sheets

Related U.S. Application Data

(60) Provisional application No. 61/354,939, filed on Jun. 15, 2010.

(51) Int. Cl.
  *B82Y 10/00*      (2011.01)
  *B82Y 40/00*      (2011.01)
  *G11B 5/855*      (2006.01)

(56) References Cited

U.S. PATENT DOCUMENTS

| | | |
|---|---|---|
| 2007/0228593 A1 | 10/2007 | Jones et al. |
| 2007/0237886 A1 | 10/2007 | Dijksman et al. |
| 2007/0289530 A1 | 12/2007 | Kataho et al. |
| 2008/0018875 A1 | 1/2008 | Schram et al. |
| 2008/0308971 A1 | 12/2008 | Liu et al. |
| 2009/0014917 A1 | 1/2009 | Hodge et al. |
| 2009/0115110 A1* | 5/2009 | Schumaker ............ B82Y 10/00 264/401 |
| 2009/0148619 A1 | 6/2009 | Labrake et al. |
| 2009/0166317 A1 | 7/2009 | Okushima et al. |
| 2009/0267268 A1 | 10/2009 | Yoneda et al. |
| 2010/0193994 A1 | 8/2010 | Wuister et al. |
| 2011/0008535 A1 | 1/2011 | Mori et al. |
| 2013/0010020 A1 | 1/2013 | Kodama |
| 2013/0213930 A1 | 8/2013 | Wakamatsu et al. |

FOREIGN PATENT DOCUMENTS

| | | |
|---|---|---|
| JP | 2011-018717 | 1/2011 |
| JP | 2011-049302 | 3/2011 |
| TW | I290665 | 12/2007 |
| WO | WO 2008/156750 | 12/2008 |
| WO | 2011115282 | 9/2011 |
| WO | 2012039517 | 3/2012 |

OTHER PUBLICATIONS

Extended European Search Report dated Nov. 4, 2013, with English Translation; Application No. 11762918.8.
TW Office Action, dated May 26, 2015; Application No. 100111057.
KR Office Action, dated Dec. 1, 2015; Application No. 2012-7028269.

* cited by examiner

FIG.3
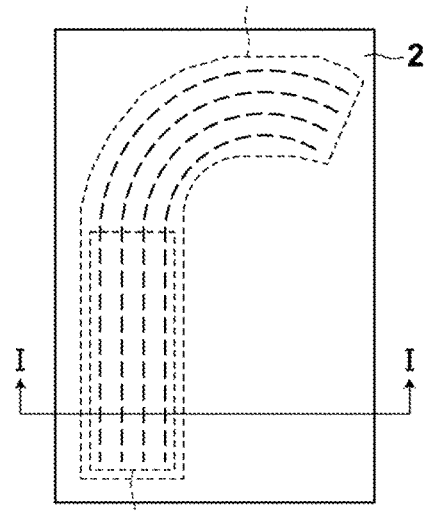
(a) LINEAR PATTERN OF PROTRUSIONS AND RECESSES P1
STRAIGHT LINEAR PATTERN OF PROTRUSIONS AND RECESSES P2
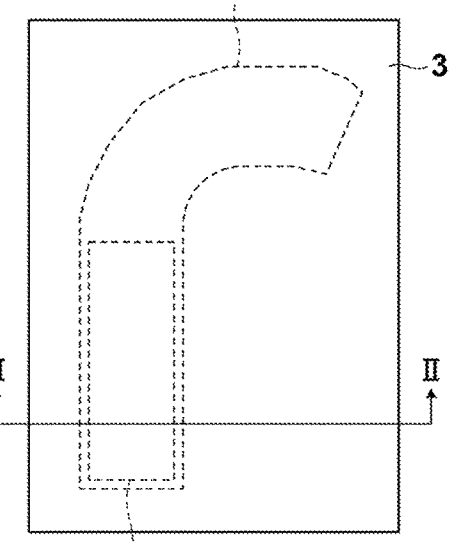
(b) LINE TRANSFER REGION R1
STRAIGHT LINE TRANSFER REGION R2
FIG.4
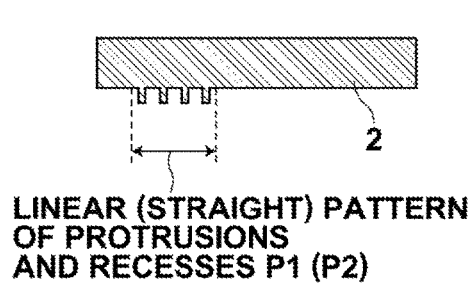
(a) LINEAR (STRAIGHT) PATTERN OF PROTRUSIONS AND RECESSES P1 (P2)
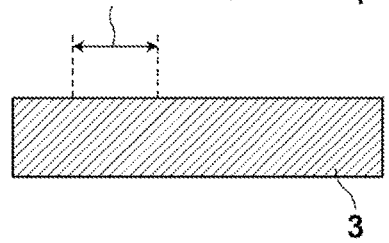
(b) LINE (STRAIGHT LINE) TRANSFER REGION R1 (R2)

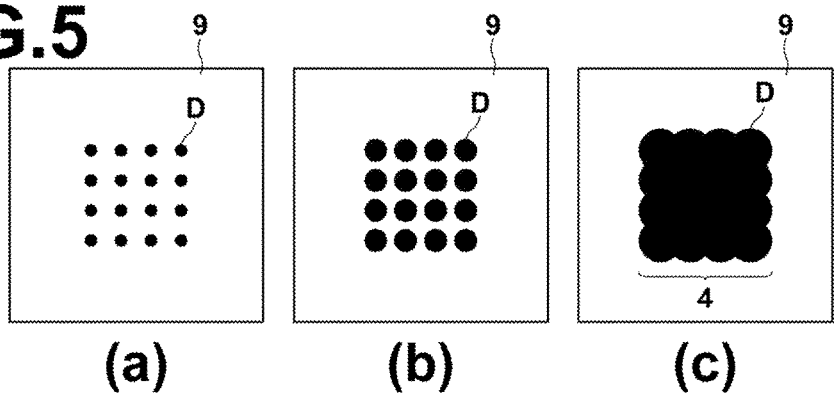
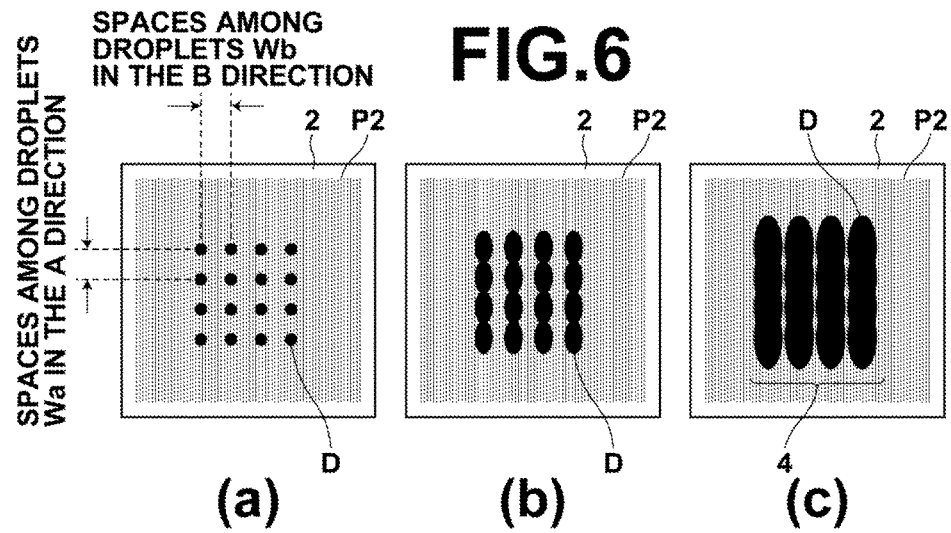
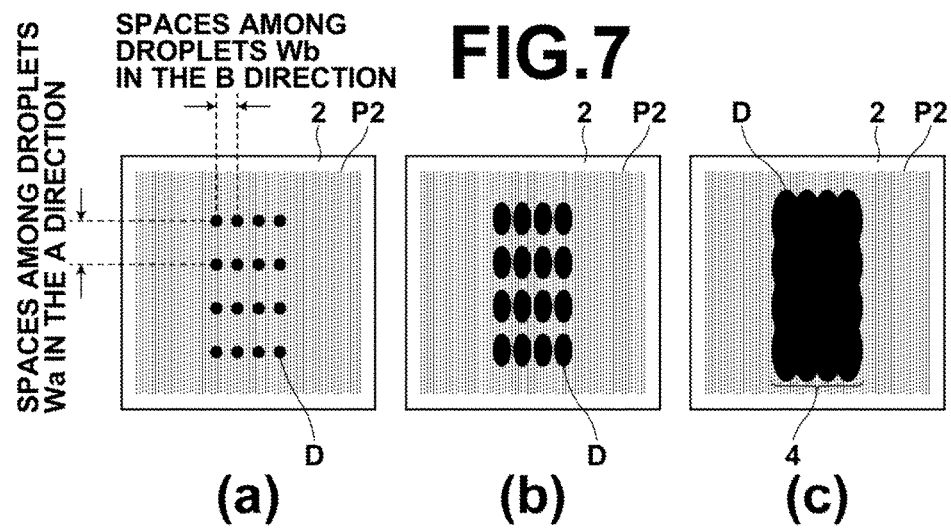

A DIRECTION

A DIRECTION

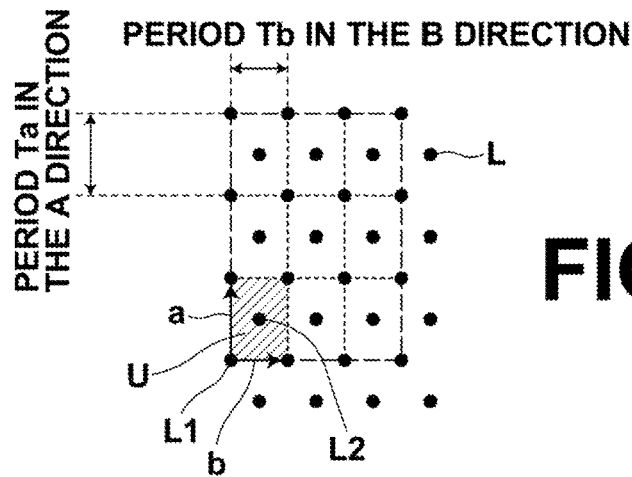
FIG.10
FIG.11
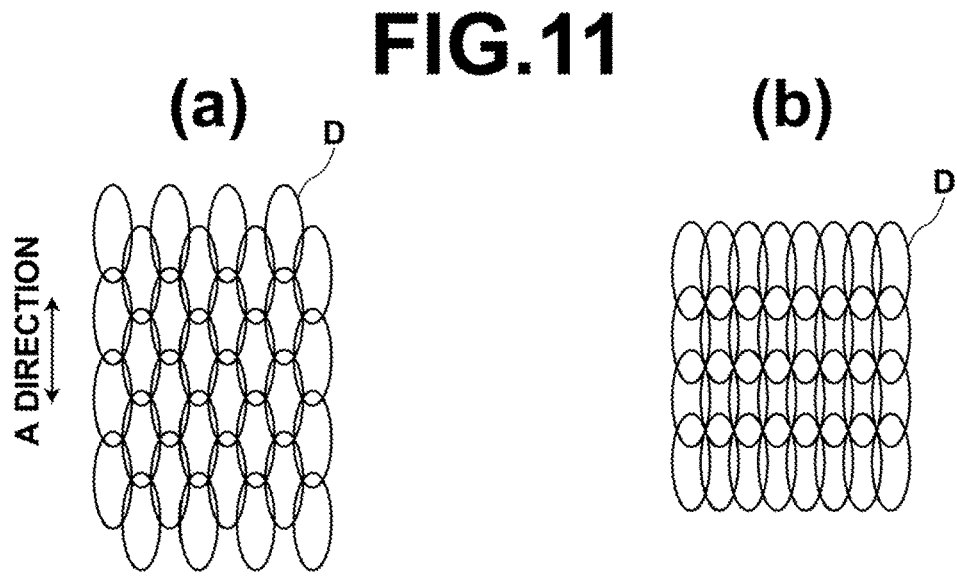
FIG.12
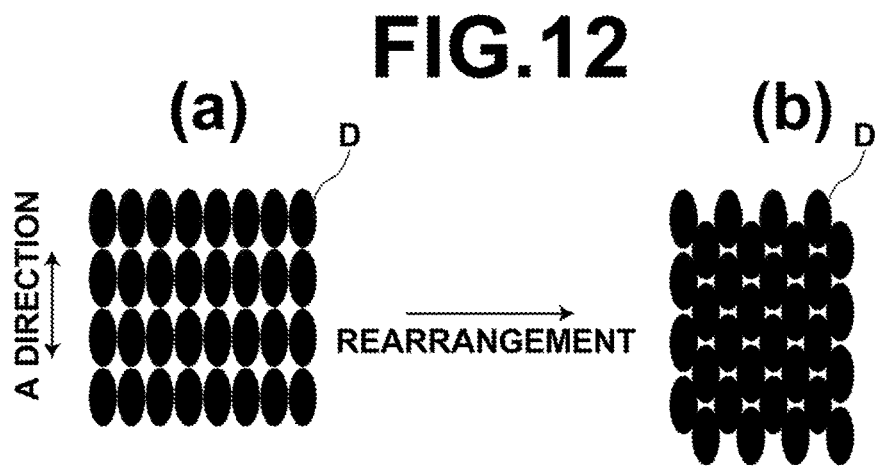

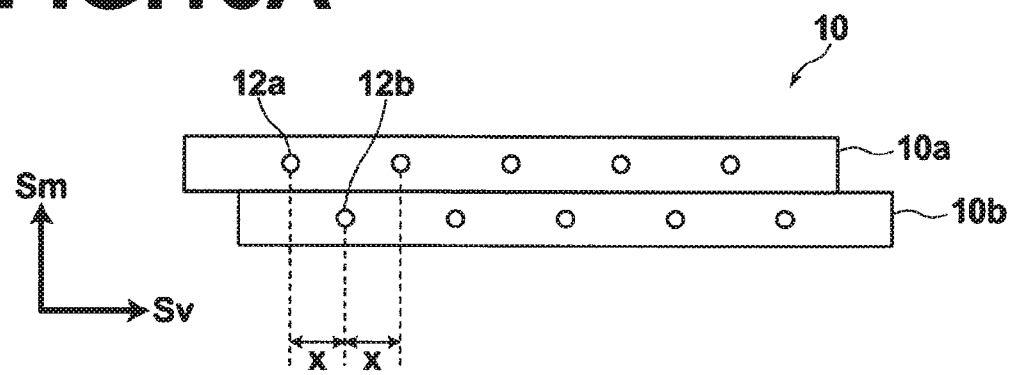
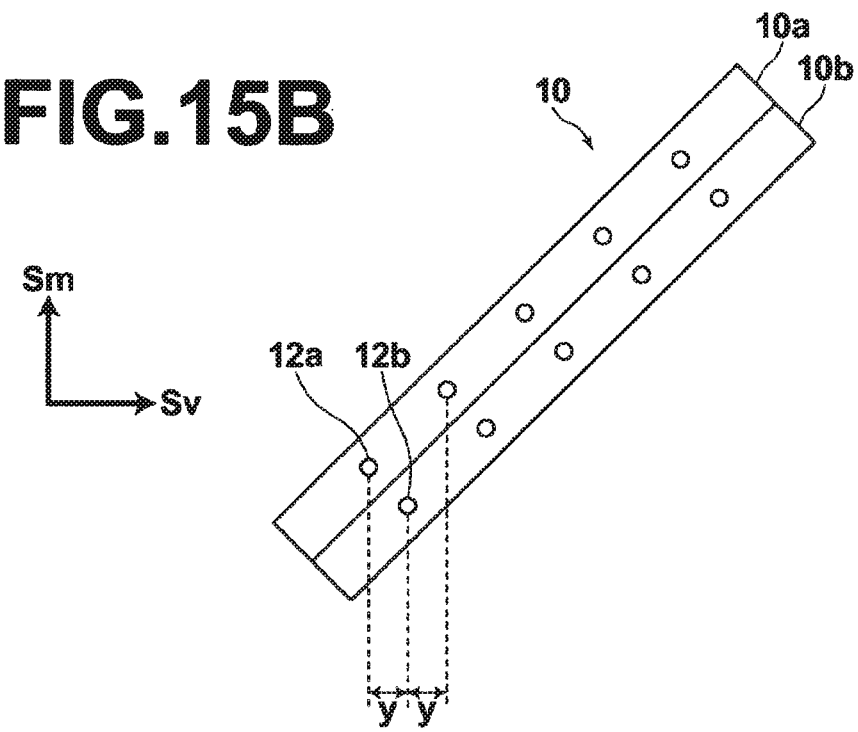

NANOIMPRINTING METHOD, AND METHOD FOR PRODUCING A DROPLET ARRANGEMENT PATTERN

TECHNICAL FIELD

The present invention is related to a nanoimprinting method that employs a mold having a fine pattern of protrusions and recesses, and particularly to a method that performs nanoimprinting after coating a substrate with resist using the ink jet method. The present invention is also related to a method for producing a droplet arrangement pattern to be employed in the nanoimprinting method. The present invention is also related to a method for fabricating substrates employing the nanoimprinting method and the method for producing a droplet arrangement pattern.

BACKGROUND ART

There are high expectations regarding utilization of pattern transfer techniques that employ a nanoimprinting method to transfer patterns onto resist coated on objects to be processed, in applications to produce magnetic recording media such as DTM (Discrete Track Media) and BPM (Bit Patterned Media) and semiconductor devices.

The nanoimprinting method is a development of the well known embossing technique employed to produce optical discs. In the nanoimprinting method, an original mold (commonly referred to as a stamper or a template), on which a pattern of protrusions and recesses is formed, is pressed against resist coated on an object to be processed. Pressing of the original onto the resist causes the resist to mechanically deform or to flow, to precisely transfer the fine pattern. If a mold is produced once, nano level fine structures can be repeatedly molded in a simple manner. Therefore, the nanoimprinting method is an economical transfer technique that produces very little harmful waste and discharge. Therefore, there are high expectations with regard to application of the nanoimprinting method in various fields.

In the conventional nanoimprinting method, an object to be processed was uniformly coated with resist by the spin coat method or the like, to form a resist film thereon. Thereafter, the surface of the mold having the pattern of protrusions and recesses thereon is pressed against the resist film, to perform pattern transfer. However, when pattern transfer is performed in this manner, there are cases in which fluctuations occur in the thickness of a residual layer (residual resist film which is not pressed during imprint molding, and remains at positions corresponding to the protrusions of the pattern of protrusions and recesses of the mold; also referred to as "residue") of the resist film on which the pattern has been transferred. In such cases, the residual layer is generally removed by dry etching with settings that enable the thickest residual layer to be removed. During such removal, problems occur, such as the base layer underneath thin portions of the residual layer being etched as well, and protrusion portions of the pattern which should remain as a mask are excessively etched, which result in the processing accuracy of a substrate deteriorating. This is considered to be due to the fact that the pressing force applied by the upper surfaces (the surfaces that face the resist film during imprinting) of protrusions having large areas and the pressing force applied by the upper surfaces of protrusions having small areas are different. Another factor is that the resist is coated uniformly, although patterns of protrusions and recesses have protrusions or recesses of difference widths by nature, and the coarse and fine recesses act as escape routes for the resist when the patterns are pressed against the resist.

In view of the above, PCT Japanese Publication No. 2008-502157, and U.S. Patent Application Publication Nos. 20090014917, 20090115110, 20070228593, and 20090148619 disclose methods that employ the ink jet method to control the amount of resist to be coated at each region of objects to be processed, according to the pattern density (the percentage of protrusions or recesses per unit area when a pattern of protrusions and recesses is viewed from above) of patterns of protrusions and recesses when molds are pressed against the objects to be processed. That is, the publications listed above employ the ink jet method to reduce fluctuations in thickness of the residual layer, by optimizing the positional distribution (droplet arrangement pattern) at which droplets of resist material are arranged on objects to be processed according to pattern densities.

In addition, Japanese Unexamined Patent Publication No. 2008-042187 discloses a method for adjusting the amount of droplets and coating orders, to solve the problem that evaporation times of components differ due to temporal differences among timings at which droplets are coated.

However, the methods disclosed in the publications listed above assume the droplets spread isotropically when the mold is pressed against the droplets, and define the droplet arrangements such that spaces among adjacent droplets are minimal. Therefore, problems of thickness fluctuations in the thicknesses of residual layers and defects due to residual gas persist, in regions of the patterns of protrusions and recesses where patterns are formed as lines.

The present invention has been developed in view of the foregoing circumstances. It is an object of the present invention to provide a nanoimprinting method that suppresses fluctuations in thickness of a residual layer and defects due to residual gas in a resist film, onto which a pattern of protrusions and recesses is transferred, in a nanoimprinting method that employs the ink jet method to coat a substrate with droplets of resist material.

It is another object of the present invention to provide a method for producing a droplet arrangement pattern to be utilized in a nanoimprinting method that employs the ink jet method to coat a substrate with droplets of resist material that enables fluctuations in thickness of a residual layer and defects due to residual gas in a resist film, onto which a pattern of protrusions and recesses is transferred, to be suppressed.

It is still another object of the present invention to provide a method for fabricating substrates that enables highly accurate and high yield fabrication of substrates, by suppressing fluctuations in thickness of a residual layer and defects due to residual gas in a resist film, onto which a pattern of protrusions and recesses is transferred.

DISCLOSURE OF THE INVENTION

A first nanoimprinting method of the present invention that achieves the above object comprises:

coating a substrate with a plurality of droplets of resist material by the ink jet method; and pressing a linear pattern of protrusions and recesses of a mold onto the surface of the substrate which is coated with the droplets, to spread the droplets on the substrate, to form a resist film constituted by bonds among the spread plurality of droplets and to transfer the linear pattern of protrusions and recesses onto the resist film;

the droplets being coated on the substrate such that the spaces among droplets in an A direction substantially parallel to the direction of the lines of the linear pattern of protrusions and recesses are longer than the spaces among droplets in a B direction substantially perpendicular to the A direction within a line transfer region of the substrate that faces the linear pattern of protrusions and recesses when the linear pattern of protrusions and recesses is pressed against the substrate.

In the present specification, the expression "linear pattern of protrusions and recesses" refers to a pattern of protrusions and recesses that causes anisotropy to occur in the spreading directions of droplets such that the shapes of the droplets approximate ellipses when the pattern is pressed against the droplets, due to the shape of the pattern. The most typical linear pattern of protrusions and recesses is a pattern of protrusions and recesses of the line and space time. The linear pattern of protrusions and recesses may be included at least at a portion of the pattern of protrusions and recesses on the surface of the mold.

The expression "resist film constituted by bonds among the spread plurality of droplets" refers to a film of resist material formed by droplets having overlapping spaces in which they spread bonding to each other when the droplets of resist materials are spread by being pressed.

The expression "line transfer region" refers to a region of the substrate that faces the linear pattern of protrusions and recesses when the linear pattern of protrusions and recesses is pressed against the substrate.

The expression "direction of the lines of the linear pattern of protrusions and recesses" refers to a direction in which spreading of the droplets is facilitated, from along the directions along the pattern formation surface of the mold.

The expression "an A direction substantially parallel to the direction of the lines" includes directions, which are practically equal to the direction of the lines of the linear pattern of protrusions and recesses, within a range that enables obtainment of the operative effects of the present invention, in addition to the direction of the lines of the linear pattern of protrusions and recesses.

The expression "a direction substantially perpendicular to the A direction" includes directions, which are practically equal to the direction perpendicular to the A direction, within a range that enables the operative effects of the present invention to be obtained, in addition to the direction perpendicular to the A direction.

The expressions "spaces among droplets in an A direction" and "spaces among droplets in a B direction" refers to the distance in the A direction and in the B direction between a droplet and another droplet arranged remote from the droplet along the A direction or along the B direction. In the case that there are a plurality of other droplets, the space refers to a distance to the immediately adjacent droplet.

Further, in the first nanoimprinting method of the present invention, it is preferable for a ratio Wa/Wb between an average space Wa between droplets in the A direction and an average space Wb between droplets in the B direction to satisfy the following formula (1)

$$1.8 \leq Wa/Wb \leq 0.52 V^{1/3}/d \tag{1}$$

In the present specification, V represents the average volume of each coated droplet, and d represents a target average thickness of the resist film (including the residual layer), onto which the pattern of protrusions and recesses is transferred following the spreading of the droplets.

In the present specification, the expression "average space between droplets" refers to a value obtained by measuring the space between the central coordinates of a plurality of droplets arranged on the substrate within the line transfer region at at least two locations. In the case that the linear pattern of protrusions and recesses changes discontinuously, the line transfer region may be divided into regions in which the linear pattern of protrusions and recesses is continuous, and the average space between droplets may be calculated for each divided region. Differences occur between set values and actual values of spaces among droplets in the ink jet method, due to discharge performance of ink jet heads, compatibility between the properties of liquids and the surfaces of substrates, conditions (such as temperature) of the environment in which ink jet apparatuses are utilized, and the accuracy of XY scanning systems during ink jet drawing. Accordingly, there is a possibility that differences from settings set in the system of an ink jet printer will occur in the spaces among droplets in the A direction and in the B direction, when arranging droplets on substrates by the ink jet method. Therefore, it is necessary to actually measure and adjust the spaces between the central coordinates of a plurality of droplets.

In the first nanoimprinting method of the present invention, it is preferable for the resolution in the A direction which is defined by an ink jet head that performs the coating with the droplets to be set lower than the resolution in the B direction which is defined by the ink jet head.

In the first nanoimprinting method of the present invention, it is preferable for:

one of the A direction and the B direction to be set as a main scanning direction in the ink jet method, and the other to be set as a sub scanning direction in the ink jet method; and the ink jet head to be set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged.

In the present specification, the expression "intervals among lattice points along the sub scanning direction" refers to the smallest distance in the sub scanning direction between a lattice point and another lattice point.

The expression "effective intervals among ink expelling outlets" refers to the smallest distance in the sub scanning direction between an ink expelling outlet and another ink expelling outlet.

A second nanoimprinting method of the present invention comprises:

coating a substrate with a plurality of droplets of resist material by the ink jet method; and pressing a straight linear pattern of protrusions and recesses of a mold onto the surface of the substrate which is coated with the droplets, to spread the droplets on the substrate, to form a resist film constituted by bonds among the spread plurality of droplets and to transfer the straight linear pattern of protrusions and recesses onto the resist film;

the droplets being coated on the substrate according to a droplet arrangement pattern constituted by a plurality of lattice points that correspond to positions at which each of the plurality of droplets are to be arranged within a straight line transfer region of the substrate that faces the straight linear pattern of protrusions and recesses when the straight linear pattern of protrusions and recesses is pressed against the substrate; and the droplet arrangement pattern having basic unit lattices having periodicity in each of an A direction substantially parallel to the direction of the lines of the straight linear pattern of protrusions and in a B direction substantially perpendicular to the A direction, and the periods of the periodicity in the A direction being longer than the periods of the periodicity in the B direction.

In the present specification, the expression "straight linear pattern of protrusions and recesses" refers to the aforementioned linear pattern of protrusions and recesses, and particularly to a pattern of protrusions and recesses that causes the long axes of the elliptical shapes of the plurality of droplets to be oriented in a single direction when the pattern is pressed against the droplets.

The expression "straight line transfer region" refers to a region of the substrate that faces the straight linear pattern of protrusions and recesses when the straight linear pattern of protrusions and recesses is pressed against the substrate.

The expression "direction of the lines of the straight linear pattern of protrusions and recesses" refers to the aforementioned direction of the lines, and particularly refers to a direction along the long axes of the plurality of ellipses.

The expression "a droplet arrangement pattern constituted by a plurality of lattice points that correspond to positions at which each of the plurality of droplets are to be arranged" refers to a two dimensional coordinate system constituted by a group of lattice points that represent the arrangement of the plurality of droplets, which functions as a reference for droplet arrangement when arranging the droplets on the substrate.

The expression "basic unit lattices" refers to the smallest repeating units of the droplet arrangement pattern, which has periodicity.

Further, it is preferable for each basic unit lattice to be a unit structure that includes lattice points $L1=0 \cdot a+0 \cdot b$ and $L2=\frac{1}{2} \cdot a+\frac{1}{2} \cdot b$, in the case that an initial point for a vector a that represents a single period in the A direction and an initial point for a vector b that represents a single period in the B direction are set at a single lattice point, and the basic unit lattice to be designated as a parallelogram formed by the vector a and the vector b.

In the present specification, the expression "unit structure" refers to a specific arrangement of lattice points that constitute the basic unit lattice. That is, the group of lattice points that constitute the droplet arrangement pattern is expressed by repetitions of basic unit lattices having the unit structures.

Further, it is preferable for a ratio Ta/Tb between a length Ta of a single period in the A direction and a length Tb of a single period in the B direction to satisfy the following formula (2)

$$1.8 \leq Ta/Tb \leq 0.52 V^{1/3}/d \quad (2)$$

In the present specification, V represents the average volume of droplets corresponding to representative lattice points of the basic unit lattice, and d represents the average thickness of the resist film (including the residual layer).

In the second nanoimprinting method of the present invention, it is preferable for the resolution in the A direction which is defined by an ink jet head that performs the coating with the droplets to be set lower than the resolution in the B direction which is defined by the ink jet head.

In the second nanoimprinting method of the present invention, it is preferable for one of the A direction and the B direction to be set as a main scanning direction in the ink jet method, and the other to be set as a sub scanning direction in the ink jet method; and the ink jet head to be set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged.

A method for producing a droplet arrangement pattern of the present invention, which is to be a reference for arranging droplets to be employed in a nanoimprinting method comprising coating a first substrate with a plurality of droplets of resist material by the ink jet method, and pressing a linear pattern of protrusions and recesses of a mold onto the surface of the first substrate which is coated with the droplets, comprises:

coating a plurality of droplets of resist material at a standard amount onto a second substrate different from the first substrate;

pressing a second mold having a pattern of protrusions and recesses, which is the same as the linear pattern of protrusions and recesses, against the surface of the second substrate which is coated with the droplets, to spread the droplets to a degree that the droplets contact each other;

causing the shapes of the spread droplets of the standard amount to approximate ellipses;

measuring the arrangement of the ellipses;

rearranging the arrangements of the measured ellipses such that the plurality of ellipses are closely packed; and obtaining a droplet arrangement pattern constituted by a plurality of lattice points that correspond to positions at which the plurality of droplets are to be arranged, by designating the centers of each of the rearranged plurality of ellipses as lattice points.

In the present specification, the expression "standard amount" refers to an approximate amount of resist material within each droplet, when coating the first substrate with the plurality of droplets of resist material.

The expression "to spread the droplets to a degree that the droplets contact each other" when pressing the second mold against the second substrate refers to not pressing the second mold against the second substrate completely, but stopping the pressing operation in a state in which the droplets contact each other, as well as to adjusting the amounts of resist material within the droplets and the droplet arrangement pattern such that the droplets contact each other after repetitively pressing the second mold against the second substrate completely.

A third nanoimprinting method of the present invention comprises:

coating a substrate with a plurality of droplets of a resist material by the ink jet method; and pressing a linear pattern of protrusions and recesses of a mold onto the surface of the substrate which is coated with the droplets, to spread the droplets on the substrate, to form a resist film constituted by bonds among the spread plurality of droplets and to transfer the linear pattern of protrusions and recesses onto the resist film;

the droplets being coated onto the substrate according to a droplet arrangement pattern produced by the method for producing a droplet arrangement pattern of the present invention.

In the third nanoimprinting method of the present invention, it is preferable for the resolution in the direction of the long axes of the ellipses which is defined by an ink jet head that performs the coating with the droplets to be set lower than the resolution in the direction of the short axes of the ellipses which is defined by the ink jet head.

In the third nanoimprinting method of the present invention, it is preferable for one of the direction of the long axes and the direction of the short axes to be set as a main scanning direction in the ink jet method, and the other to be set as a sub scanning direction in the ink jet method; and for the ink jet head to be set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged.

A method for fabricating substrates of the present invention comprises:

forming a resist film, on which a pattern of protrusions and recesses is formed, on a substrate by a nanoimprinting method of the present invention as described above; and performing dry etching using the resist film as a mask, to form a pattern of protrusions and recesses corresponding to the pattern of protrusions and recesses transferred on the resist film, to obtain a substrate having a predetermined pattern thereon.

In the first nanoimprinting method of the present invention, the droplets are coated on the substrate such that the spaces among droplets in the A direction substantially parallel to the direction of the lines of the linear pattern of protrusions and recesses are longer than the spaces among droplets in the B direction substantially perpendicular to the A direction. That is, the droplets are arranged taking the direction of the lines into consideration. Therefore, the droplets can be spread evenly, even if anisotropy occurs in the spreading direction of the droplets due to the pattern shape of the linear pattern of protrusions and recesses. As a result, fluctuations in thickness of residual resist film, on which a pattern of protrusions and recesses has been transferred, and defects due to residual gas, can be suppressed in a nanoimprinting method that performs nanoimprinting after coating a substrate with droplets of resist material using the ink jet method.

Further, in the second nanoimprinting method of the present invention, the droplets are coated onto the straight line transfer region of the substrate according to the droplet arrangement pattern. The droplet arrangement pattern has the basic unit lattices having periodicity in both the A direction, which is substantially parallel to the direction of the lines of the linear pattern of protrusions and recesses, and the B direction, which is substantially perpendicular to the B direction. The periods of the periodicity in the A direction are longer than the periods of the periodicity in the B direction, that is, the droplets are arranged taking the direction of the lines into consideration. Therefore, the second nanoimprinting method exhibits the same advantageous effects as those exhibited by the first nanoimprinting method of the present invention.

In the first and second nanoimprinting methods of the present invention, a configuration may be adopted, wherein: the resolution in the A direction which is defined by an ink jet head that performs the coating with the droplets is set to be lower than the resolution in the B direction which is defined by the ink jet head. In this case, throughput during droplet discharge can be improved, while maintaining the resolution performance of the ink jet printer as a whole.

In the first and second nanoimprinting methods of the present invention, a configuration may be adopted, wherein: one of the A direction and the B direction is set as a main scanning direction in the ink jet method, and the other is set as a sub scanning direction in the ink jet method; and the ink jet head is set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged. In this case, the droplets can be coated efficiently, and the throughput during droplet discharge can be improved further.

In the third nanoimprinting method of the present invention, the droplets are coated on the substrate according to the droplet arrangement pattern which is produced by the method for producing a droplet arrangement pattern of the present invention. As a result, the droplets are arranged taking the direction of the lines into consideration. Therefore, the third nanoimprinting method exhibits the same advantageous effects as those exhibited by the first nanoimprinting method of the present invention.

In the third nanoimprinting method of the present invention, a configuration may be adopted, wherein: the resolution in the direction of the long axes of the ellipses which is defined by an ink jet head that performs the coating with the droplets is set to be lower than the resolution in the direction of the short axes of the ellipses which is defined by the ink jet head. In this case, throughput during droplet discharge can be improved, while maintaining the resolution performance of the ink jet printer as a whole.

In the third nanoimprinting method of the present invention, a configuration may be adopted, wherein: one of the direction of the long axes and the direction of the short axes is set as a main scanning direction in the ink jet method, and the other is set as a sub scanning direction in the ink jet method; and the ink jet head is set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged. In this case, the droplets can be coated efficiently, and the throughput during droplet discharge can be improved further.

The method for producing a droplet arrangement pattern of the present invention comprises the steps of: coating a plurality of droplets of resist material at a standard amount onto a test substrate; pressing a test mold having a pattern of protrusions and recesses, which is at least partially the same as the linear pattern of protrusions and recesses, against the surface of the test substrate which is coated with the droplets, to spread the droplets to a degree that the droplets contact each other; causing the shapes of the spread droplets of the standard amount to approximate ellipses; measuring the arrangement of the ellipses; rearranging the arrangements of the measured ellipses such that the plurality of ellipses are closely packed; and obtaining a droplet arrangement pattern constituted by a plurality of lattice points that correspond to positions at which the plurality of droplets are to be arranged, by designating the centers of each of the rearranged plurality of ellipses as lattice points. A droplet arrangement pattern that takes the direction of the lines of the linear pattern of protrusions and recesses into consideration is obtained by the method for producing a droplet arrangement pattern of the present invention. Therefore, fluctuations in thickness of residual resist film, on which a pattern of protrusions and recesses has been transferred, and defects due to residual gas, can be suppressed in a nanoimprinting method that performs nanoimprinting after coating a substrate with droplets of resist material using the ink jet method, by utilizing the droplet arrangement pattern produced in this manner.

Further, the method for fabricating substrates performs dry etching using a resist film, on which a pattern has been transferred by a nanoimprinting method of the present invention, as a mask. Dry etching is performed using the mask formed in this manner, which has neither fluctuations in the thickness of a residual layer nor defects due to residual gas. Therefore, substrates can be produced with high accuracy and at high yields.

BRIEF DESCRIPTION OF DRAWINGS

FIG. 3A is a diagram that schematically illustrates a mold having linear patterns of protrusions and recesses formed thereon.

FIG. 3B is a diagram that schematically illustrates a substrate onto which the mold of FIG. 3A is pressed as a target of processing.

FIG. 4A is a schematic sectional diagram taken along line I-I of FIG. 3A.

FIG. 4B is a schematic sectional diagram taken along line II-II of FIG. 3B.

FIG. 5A is a diagram that schematically illustrates a transparent substrate on which droplets are uniformly arranged, in a state prior to having a flat plate pressed thereon.

FIG. 5B is a diagram that schematically illustrates the manner in which droplets, which are uniformly arranged on a transparent substrate, spread as a flat plate is pressed thereon.

FIG. 5C is a diagram that schematically illustrates a resist film, formed as a result of uniformly arranging droplets onto a transparent substrate and then pressing a flat plate onto the substrate.

FIG. 6A is a diagram that schematically illustrates a transparent substrate on which droplets are uniformly arranged, in a state prior to having a mold pressed thereon.

FIG. 6B is a diagram that schematically illustrates the manner in which droplets, which are uniformly arranged on a transparent substrate, spread as a mold is pressed thereon.

FIG. 6C is a diagram that schematically illustrates a resist film, formed as a result of uniformly arranging droplets onto a transparent substrate and then pressing a mold onto the substrate.

FIG. 7A is a diagram that schematically illustrates a transparent substrate on which droplets are arranged taking the direction of lines into consideration, in a state prior to having a mold pressed thereon.

FIG. 7B is a diagram that schematically illustrates the manner in which droplets, which are arranged on a transparent substrate taking the direction of lines into consideration, spread as a mold is pressed thereon.

FIG. 7C is a diagram that schematically illustrates a resist film, formed as a result of arranging droplets onto a transparent substrate taking the direction of lines into consideration and then pressing a mold onto the substrate.

FIG. 10 is a diagram that schematically illustrates a droplet arrangement pattern in a second nanoimprinting method.

FIG. 11A is a diagram that schematically illustrates the outer edges of spread droplets in the case that there are two lattice points within a unit structure.

FIG. 11B is a diagram that schematically illustrates the outer edges of spread droplets in the case that there is one lattice point within a unit structure.

FIGS. 12A and 12B are schematic diagrams for explaining rearrangement of droplets that approximate ellipses.

FIG. 15A is a first schematic diagram for explaining arrangement intervals among ink expelling outlets and effective intervals among ink expelling outlets in the case that the ink expelling outlets of an ink jet head are arranged in a plurality of rows.

FIG. 15B is a second schematic diagram for explaining arrangement intervals among ink expelling outlets and effective intervals among ink expelling outlets in the case that the ink expelling outlets of an ink jet head are arranged in a plurality of rows.

BEST MODE FOR CARRYING OUT THE INVENTION

Figure 1:
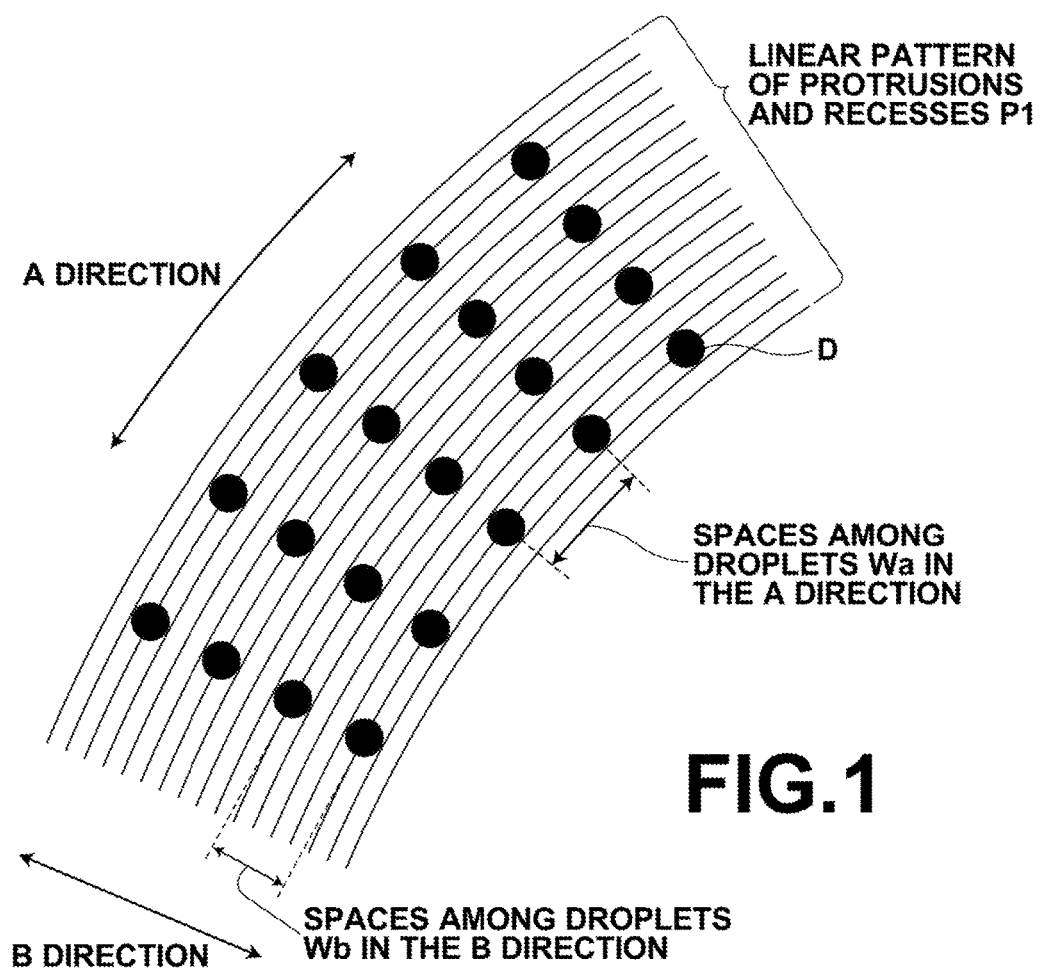
FIG. 1 is a diagram that schematically illustrates the relationship between the direction of lines of a linear pattern of protrusions and recesses, and a coating arrangement for a plurality of droplets that include photocuring resin, in a first imprinting method.

Hereinafter, embodiments of the present invention will be described with reference to the attached drawings. However, the present invention is not limited to the embodiments to be described below. Note that in the drawings, the dimensions of the constitutive elements are drawn differently from the actual dimensions thereof, in order to facilitate visual recognition thereof.

[First Nanoimprinting Method]

First, an embodiment of a first nanoimprinting method of the present invention will be described. Note that in this embodiment, photocuring nanoimprinting that cures a resist film with light will be described as an example of the first nanoimprinting method.

In the first nanoimprinting method, a quartz substrate is coated with a plurality of droplets that contain photocuring resin by the ink jet method such that the spaces among droplets in an A direction substantially parallel to the direction of lines of a linear pattern of protrusions and recesses are longer than the spaces among droplets in a B direction substantially perpendicular to the A direction within a line transfer region of the quartz substrate that faces the linear pattern of protrusions and recesses of an Si mold (FIG. 1). Then, the linear pattern of protrusions and recesses of the Si mold is pressed onto the surface of the quartz substrate which is coated with the droplets, to spread the droplets on the quartz substrate thereby forming a photocuring resin film constituted by bonds among the spread plurality of droplets. Thereafter, the photocuring resin film is exposed to ultraviolet rays from the side of the quartz substrate to cure the photocuring resin film. Finally, the Si mold is separated from the photocuring resin film after it cures, to transfer the linear pattern of protrusions and recesses onto the photocuring resin film.

The photocuring resin film functions as a resist film during an etching step to be performed later. FIG. 1 is a diagram that schematically illustrates the relationship between the direction of lines of the linear pattern of protrusions and recesses, and a coating arrangement for the plurality of droplets that include photocuring resin, in the first imprinting method. Here, the expression "an A direction substantially parallel to the direction of the lines" of the linear pattern of protrusions and recesses includes directions, which are practically equal to the direction of the lines of the linear pattern of protrusions and recesses, within a range that enables obtainment of the operative effects of the present invention, in addition to the direction of the lines of the linear pattern of protrusions and recesses. Preferably, the expression "an A direction substantially parallel to the direction of the lines" refers to directions within an angular range of ±30 degrees from the direction of the lines, and more preferably to directions within an angular range of ±15 degrees from the direction of the lines. Meanwhile, the expression "a direction substantially perpendicular to the A direction" includes directions, which are practically equal to the direction perpendicular to the A direction, within a range that enables the operative effects of the present invention to be obtained, in addition to the direction perpendicular to the A direction. Preferably, the expression "a direction substantially perpendicular to the A direction" refers to directions within an angular range of ±30 degrees from the direction perpendicular to the direction of the lines, and more preferably to directions within an angular range of ±15 degrees from the direction perpendicular tot he direction of the lines.

(Photocuring Resin)

The material of the photocuring resin is not particularly limited. In the present embodiment, a photocuring resin prepared by adding a photopolymerization initiator (2% by mass), a surfactant W-1 (0.1% by mass), a surfactant W-2 (0 0.04% by mass), an antioxidant A-1 (1% by mass), and an antioxidant A-2 (1% by mass) to a polymerizable compound R-1. The photocuring resin produced by the above procedures can be cured by ultraviolet light having a wavelength of 360 nm. With respect to resins having poor solubility, it is preferable to add a small amount of acetone or acetic ether to dissolve the resin, and then to remove the solvent.

<Polymerizable Compound>

R-1: benzyl acrylate (V#160 by Osaka Organic Chemical Industries, K.K.)

<Photopolymerization Initiator>

P-1: 2,4,6-trimethylbenzoyl-ethoxyphenyl-phosphine oxide (Lucirin TPO-L by BASF)

<Surfactants>

W-1: fluorochemical surfactant (fluorochemical surfactant by Tochem Products, K.K.)

W-2: silicone surfactant (Megafac Peintad 31 by Dainippon Ink Chemical Industries, K.K.)

<Antioxidant Agents>

A-1: Sumilizer GA80 by Sumitomo Chemical Industries, K.K.

A-2: ADK STAB AO503 by K.K. ADEKA (Si Mold)

The Si mold to be utilized in the present embodiment may be produced by the following procedures, for example. First, a Si substrate is coated by a photoresist liquid such as a novolac resin or an acrylic resin by the spin coat method or the like, to form a photoresist layer. Next, a laser beam (or an electron beam) is irradiated onto the Si substrate, to expose a predetermined pattern on the surface of the photoresist layer. Then, the photoresist layer is developed to remove the exposed portions. Finally, selective etching is performed by RIE or the like, using the photoresist layer after the exposed portions are removed, to obtain the Si mold having the predetermined pattern.

The mold to be employed in the imprinting method of the present invention may be that which has undergone a mold release process to improve separation properties between the photocuring resin and the mold. Examples of such a mold include: those which have been processed by silicone or fluorine silane coupling agents. Commercially available mold release agents such as Optool DSX by Daikin Industries K.K. and Novec EGC-1720 by Sumitomo 3M K.K. may be favorably employed. Meanwhile, although the present embodiment is described as a case in which the Si mold is employed, the mold is not limited to an Si mold, and a quartz mold may be employed. In this case, the quartz mold may be produced by the method for producing a mold to be described later.

(Substrate)

The quartz substrate is employed to enable the photocuring resin to be exposed to light. The quartz substrate to be employed with the Si mold is not particularly limited as long as it has light transmissive properties and has a thickness of 0.3 mm or greater, and may be selected as appropriate according to intended use. Examples of the quartz substrate include: those in which the surface of a quartz substrate is coated with a silane coupling agent; those in which a metal layer of Cr, W, Ti, Ni, Ag, Pt, or Au is provided on the surface of a quartz substrate; those in which a metal oxide layer of $CrO_2$, $WO_2$, or $TiO_2$ is provided on the surface of a quartz substrate; and those in which a metal layer of Cr, W, Ti, Ni, Ag, Pt, or Au or a metal oxide layer of $CrO_2$, $WO_2$, or $TiO_2$ is provided on the surface of a quartz substrate, which is then coated with a silane coupling agent. The thickness of the metal layer or the metal oxide layer is generally 30 nm or less, and preferably 20 nm or less. If the thickness of the metal layer or the metal oxide layer exceeds 30 nm, the UV transmissive properties deteriorate, and curing failure of the photocuring resin becomes likely to occur.

In addition, the expression "light transmissive properties" refers to a degree of light transmissivity that enables sufficient curing of the photocuring resin film when light enters the side of the substrate opposite that on which the photocuring resin film is formed. Specifically, the "light transmissive properties" refers to light transmissivity of 5% or greater with respect to light having wavelengths of 200 nm or greater from the side of the substrate opposite that on which the photocuring resin film is formed to the side of the substrate on which the photocuring resin film is formed.

It is preferable for the thickness of the quartz substrate to be 0.3 mm or greater. If the thickness of the quartz substrate is less than 0.3 mm, it is likely to become damaged during handling or due to pressure during imprinting.

Meanwhile, substrates to be employed with the quartz mold are not limited with regard to the shape, the structure, the size or the material thereof, and may be selected according to intended use. With respect to the shape of the substrate, a substrate having a discoid shape may be utilized in the case that nanoimprinting is performed to produce a data recording medium. With respect to the structure of the substrate, a single layer substrate may be employed, or a laminated substrate may be employed. With respect to the material of the substrate, the material may be selected from among known materials for substrates, such as silicon, nickel, aluminum, glass, and resin. These materials may be utilized singly or in combination. The substrate may be produced, or may be those which are commercially available. The thickness of the substrate is not particularly limited, and may be selected according to intended use. However, it is preferable for the thickness of the substrate to be 0.05 mm or greater, and more preferably 0.1 mm or greater. If the thickness of the substrate is less than 0.05 mm, there is a possibility that the substrate will flex during close contact with the mold, resulting in a uniform close contact state not being secured.

(Linear Pattern of Protrusions and Recesses)

Linear patterns of protrusions and recesses are formed on the Si mold as patterns to be transferred. The expression "linear pattern of protrusions and recesses" refers to a pattern of protrusions and recesses that causes anisotropy to occur in the spreading directions of droplets such that the shapes of the droplets approximate ellipses when the pattern is pressed against the droplets, due to the shape of the pattern. A pattern of protrusions and recesses that causes the long axes of the elliptical shapes of the plurality of droplets to be oriented in a single direction when the pattern is pressed against the droplets is referred to as a "straight linear pattern of protrusions and recesses".

The expression "direction of the lines of the linear pattern of protrusions and recesses" refers to a direction in which spreading of the droplets is facilitated, from along the directions along the pattern formation surface of the mold.

In other words, the expression "direction of the lines of the linear pattern of protrusions and recesses" refers to a direction along the long axes of the plurality of ellipses that the droplets approximate when the linear pattern of protrusions and recesses is pressed against the droplets.

Figure 2:
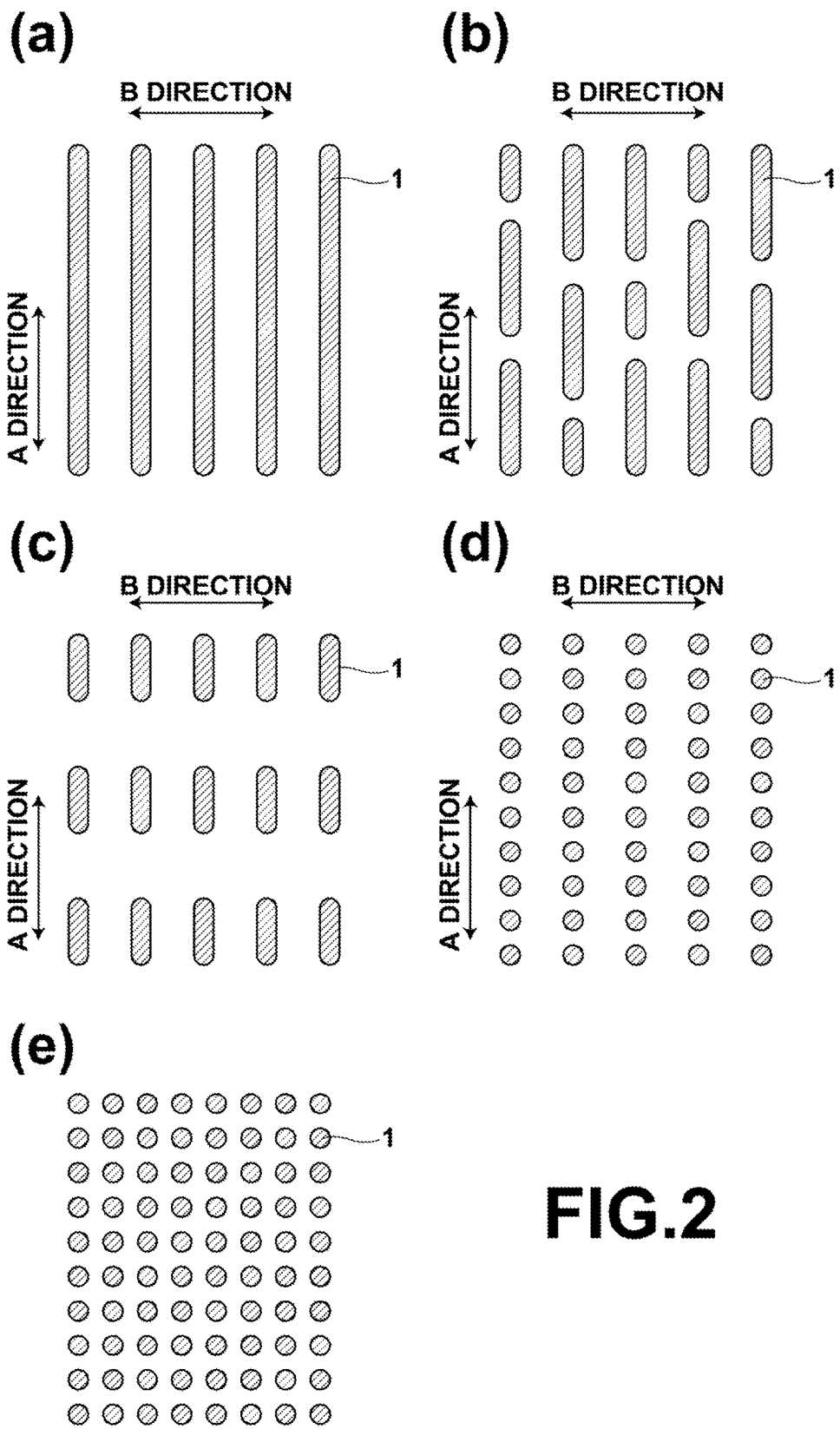
FIG. 2A is a diagram that schematically illustrates an example of a linear pattern of protrusions and recesses.
FIG. 2B is a diagram that schematically illustrates another example of a linear pattern of protrusions and recesses.
FIG. 2C is a diagram that schematically illustrates still another example of a linear pattern of protrusions and recesses.
FIG. 2D is a diagram that schematically illustrates still yet another example of a linear pattern of protrusions and recesses.
FIG. 2E is a diagram that schematically illustrates an example of a pattern which is not a linear pattern of protrusions and recesses.

FIGS. 2A through 2D are diagrams that schematically illustrate examples of linear patterns of protrusions and recesses. FIG. 2A, FIG. 2B, and FIG. 2C are schematic diagrams that illustrate patterns of protrusions and recesses of the line and space type, in which elongated protrusions 1 are arranged parallel to each other. FIG. 2D is a schematic diagram that illustrates a pattern, in which rows of dot shaped protrusions 1, which are densely arranged in a single direction, are arranged parallel to each other. In these patterns, it is easier for the coated droplets to spread within spaces between the protrusions 1. Therefore, anisotropy occurs in the spreading of the droplets, and the shapes of the spread droplets approximate ellipses. Accordingly, the direction of the lines is a direction along the length direction of the elongate protrusions, or a direction along the length direction of the rows of densely arranged dot shaped protrusions. FIG. 2A through FIG. 2D illustrate cases in which the protrusions 1 are formed and/or arranged as straight lines. However, the linear patterns are not limited to straight linear patterns, and the linear patterns may be formed or arranged such that they curve and/or zigzag. Note that FIG. 2E is a diagram that schematically illustrates a pattern in which dot shaped protrusions 1 are uniformly arranged in both vertically and horizontally. Because anisotropy does not clearly occur in the spreading direction of droplets, such a pattern is not a linear pattern of protrusions and recesses as defined in the present specification.

As described previously, direction of the lines of the linear pattern of protrusions and recesses is the direction in which it is easy for the droplets to spread. Therefore, in the case that the linear pattern of protrusions and recesses includes patterns of protrusions and recesses that curve and/or zigzag, the direction of the lines will reflect such shapes, and will be curves and/or zigzags. In these cases, the A direction and the B direction are basically defined with the point that each droplet is arranged as a reference.

However, in the case that the direction of the lines is curved or a plurality of straight linear directions within the linear pattern of protrusions and recesses, there are case in which it is necessary to define a single straight linear direction as the direction of the lines of the linear pattern of protrusions and recesses, due to the relationship between a main scanning direction and a sub scanning direction in the ink jet method. In such cases, the shapes of the linear pattern of protrusions and recesses are considered individually, and a single straight linear direction is selected as the "direction of the lines" that reflects the linear pattern of protrusions and recesses. The selection of such a direction may be performed by considering which direction the pressed droplets are easy to spread in as a whole, for example. More specifically, the operation of pressing a plurality of droplets coated on a substrate with a linear pattern of protrusions and recesses may be performed experimentally in advance. Then, a direction in which the greatest number of droplets spread may be selected as the single straight linear direction "that reflects the linear pattern of protrusions and recesses". Note that such selection is not always necessary. For example, in the case that droplets are coated on a discoid substrate while the substrate is being rotated, it is possible to match the main scanning direction and the direction of the lines along the circumference even if an ink jet head is fixed.

(Method for Coating the Photocuring Resin)

An ink jet printer is employed to arrange the droplets of photocuring resin onto the substrate. Examples of ink jet heads that expel photocuring resin from nozzles include the piezoelectric type, the thermal type, and the electrostatic type. From among these, the piezoelectric type of ink jet head, in which the amount of photocuring resin in each droplet and the expulsion speed are adjustable, is preferable. The amount of photocuring resin in each droplet and the expulsion speed are set and adjusted prior to arranging the droplets of photocuring resin onto the substrate. For example, it is preferable for the amount of photocuring resin in each droplet to be adjusted to be greater at regions at which the spatial volume of the recesses of the pattern of protrusions and recesses is large, and to be smaller at regions at which the spatial volume of the recesses of the pattern of protrusions and recesses is small. The droplets are arranged on the substrate according to a predetermined droplet arrangement pattern after the adjustments are performed.

In the first nanoimprinting method of the present embodiment, it is preferable for the resolution in the A direction which is defined by the ink jet head that performs the coating with the droplets to be set lower than the resolution in the B direction which is defined by the ink jet head.

In the first nanoimprinting method of the present invention, it is preferable for: one of the A direction and the B direction to be set as a main scanning direction in the ink jet method, and the other to be set as a sub scanning direction in the ink jet method; and for the ink jet head to be set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged. Note that details regarding the settings of the ink jet head will be described later.

The droplet arrangement pattern is a two dimensional coordinate system constituted by a group of lattice points that correspond to the arrangement locations of the droplets, and include information regarding which regions of the substrate become line transfer regions or straight line transfer regions. As illustrated in FIG. 3B and FIG. 4B, the "line transfer regions" and the "straight line transfer regions" refer to regions R1 and R2 that face a linear pattern of protrusions and recesses P1 and a straight linear pattern of protrusions and recesses P2 when the linear pattern of protrusions and recesses P1 and the straight linear pattern of protrusions and recesses P2 are pressed against a substrate 3. FIG. 3A is a diagram that schematically illustrates a mold 2 having the linear pattern of protrusions and recesses P1 formed thereon. FIG. 3B is a diagram that schematically illustrates the substrate 3, onto which the mold 2 is pressed as a target of processing. FIG. 4A and FIG. 4B are schematic sectional views taken along line I-I and line II-II of FIG. 3A and FIG. 3B, respectively. The portions of the substrate 3 illustrated in FIG. 4B that faces the patterns of protrusions and recesses is the line transfer region R1 and the straight line transfer region R2.

The droplet arrangement pattern of the present embodiment has two dimensional coordinate information in which intervals among lattice points along the A direction, which is substantially parallel to the direction of the lines of the linear pattern of protrusions and recesses, are greater than intervals among lattice points along the B direction, which is substantially perpendicular to the A direction. Thereby, the spaces among droplets in the A direction substantially parallel to the direction of the lines of the linear pattern of protrusions and recesses become longer than the spaces among droplets in the B direction substantially perpendicular to the A direction.

This droplet arrangement pattern takes the fact that anisotropy occurs in the spreading direction of the droplets along the direction of the lines of the linear pattern of protrusions and recesses into consideration. For example, FIG. 5A through FIG. 5C are diagrams that schematically illustrate the manner in which droplets D, which are uniformly arranged on a transparent substrate such as a quartz substrate, spread as a flat plate 9 without a pattern of protrusions and recesses thereon is pressed against the substrate. FIGS. 6A through 6C are diagrams that schematically illustrate the manner in which droplets D, which are uniformly arranged on a transparent substrate, spread as a mold 2 having a straight linear pattern of protrusions and recesses P2 is pressed thereon. In the case illustrated in FIG. 5A through FIG. 5C, the droplets D spread isotropically. Therefore, no problems occur if the arrangement of the droplets D does not take the vertical and horizontal directions into consideration, and a resist film 4 can be formed by the uniformly arranged droplets D. However, in the case illustrated in FIG. 6A through FIG. 6C, the droplets D spread anisotropically. Therefore, if the amounts of resist in the droplets are the same, it is necessary to take the straight line direction A into consideration. That is, if the spaces among droplets Wa in the A direction and the spaces among droplets Wb in the B direction are equal, the amount of the droplets D in the A direction, in which it is easy for the droplets D to spread, will become excessive, and fluctuations will occur in the thickness of the resist film 4. At the same time, there will be an insufficient amount of the droplets D in the B direction, in which it is not easy for the droplets D to spread, and there is a possibility that defects will occur in the resist film 4 due to residual gas. Therefore, the present invention takes the direction of the lines A of the pattern of protrusions and recesses, that is, the ease and difficulty in the spreading of the droplets D, into consideration in the case that the mold 2 having the straight linear pattern of protrusions and recesses P2 is employed. Specifically, the arrangement of the droplets D is set such that the spaces among droplets Wa in the A direction are wide and the spaces among droplets Wb in the B direction are narrow, as illustrated in FIG. 7A through FIG. 7C. Thereby, fluctuations in the thickness of the resist film 4 and defects due to residual gas are suppressed compared to cases in which the straight line direction A is not taken into consideration.

It is preferable for a ratio Wa/Wb between an average space Wa between droplets in the A direction and an average space Wb between droplets in the B direction to satisfy the following formula (1)

$$1.8 \leq Wa/Wb \leq 0.52 V^{1/3}/d \tag{1}$$

In formula (1), V represents the average volume of each coated droplet, and d represents a target average thickness of the resist film (including the residual layer), onto which the pattern of protrusions and recesses is transferred following the spreading of the droplets.

Figure 8:
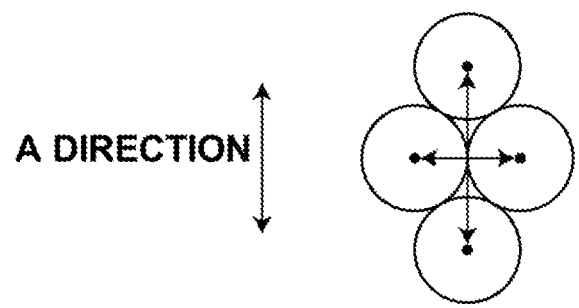
FIG. 8 is a diagram that schematically illustrates a state in which circles are closely packed, taking the direction of lines into consideration.

The reason why the lower limit of the value of the ratio Wa/Wb is set to 1.8 will be described. In the case that circular droplets are closely packed and arranged as illustrated in FIG. 8, the space between droplets Wa in the A direction is approximately 1.73 times the space between droplets Wb in the B direction. Therefore, the droplets can be utilized more efficiently in cases that the droplets spread into elliptical shapes, by setting the value of Wa/Wb to be a value greater than 1.73.

Meanwhile, the reason why the upper limit of the value of the ratio Wa/Wb is set to 0.52 $V^{1/3}/d$ is because actual spreading of the droplets in the A direction is limited by the average volume V of each droplet and the desired average thickness d of the resist film. Specifically, this value is derived as described below.

Figure 9:
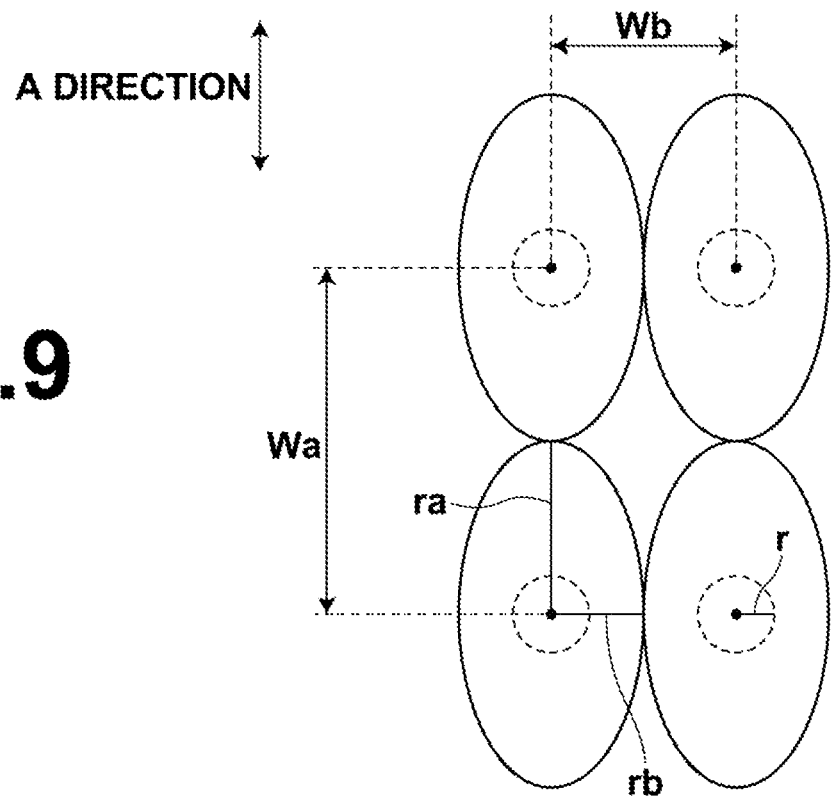
FIG. 9 is a diagram that schematically illustrates the manner in which droplets spread, when a ratio between an average space between droplets Wa in an A direction and an average space between droplets Wb in a B direction and a ratio between the radii in the direction of the long axes and the radii in the direction of the short axes of elliptical shapes when the droplets are spread match.

As illustrated in FIG. 9, it is preferable for elliptical droplets to spread via a state in which they simultaneously contact other elliptical droplets adjacent thereto in both the A direction (the direction of the long axes) and the B direction (the direction of the short axes) as the shapes of the spreading droplets approximate ellipses, to minimize overlapping portions of the spread droplets when determining the droplet arrangement. This means that it is preferable for the value of Wa/Wb to be the same as a ratio ra/rb between the radius ra of the ellipses in the direction of the long axes and the radius rb of the ellipses in the direction of the short axes. The range of values for Wa/Wb is determined by the range of possible values for ra/rb.

Therefore, what the possible values for ra/rb are will be described in the case that the volume of each coated droplet is V and the desired average thickness of the resist film is d will be described hereinbelow.

First, $V=\pi \cdot ra \cdot rb \cdot d$, and therefore, the following Formula (3) holds true.

$$\frac{ra}{rb} = \frac{V}{\pi (rb)^2 d} \tag{3}$$

Generally, the radius rb of the short axis and the radius r of a droplet contact surface prior to spreading (the radius of a circle that approximates the contact surface between the droplet prior to spreading and the substrate) have the relationship rb≥r (rb=r is for cases in which the droplet does not spread in the B direction). Therefore, the possible range of values for ra/rb can be expressed by the following Formula (4).

$$\frac{ra}{rb} \leq \frac{V}{\pi r^2 d} \tag{4}$$

Meanwhile, the radius r of the droplet contact surface prior to spreading can be expressed by the following Formula (5), using the volume V of the droplet and a contact angle θ.

$$r = \sqrt{\frac{V\sin^3\theta}{\pi[(\cos^3\theta)/3 - \cos\theta + 2/3]}} \tag{5}$$

By substituting Formula (5) into Formula (4), Formula (6) below is obtained, and then Formula (7) is applied to obtain Formula (8).

$$\frac{ra}{rb} \leq \frac{1}{\pi}\left\{\frac{\sin^3\theta}{\pi[(\cos^3\theta)/3 - \cos\theta + 2/3]}\right\}^{-2/3} \frac{V^{1/3}}{d} \tag{6}$$

$$F(\theta) = \frac{1}{\pi}\left\{\frac{\sin^3\theta}{\pi[(\cos^3\theta)/3 - \cos\theta + 2/3]}\right\}^{-2/3} \tag{7}$$

$$\frac{ra}{rb} \leq F(\theta)\frac{V^{1/3}}{d} \tag{8}$$

Here, F(θ) in Formula (7) is a function that depends only on the contact angle θ. Generally, it is preferable for the contact angle θ to be small, considering close contact properties between the droplet and the substrate. The contact angle θ is set at least to be within a range from 0°<θ≤90°, preferably within a range from 0°<θ≤30°, and more preferably within a range from 0°<θ≤10°. The following Formula (9) is obtained by taking the facts that F(θ) is a monotonously increasing function in the case that 0°<θ≤90° and 0<F(θ)≤0.52 into consideration.

$$\frac{ra}{rb} \leq 0.52\frac{V^{1/3}}{d} \tag{9}$$

The upper limit of the value of Wa/Wb was set to 0.52 $V^{1/3}/d$ for the reason described above.

(Mold Pressing Step)

The amount of residual gas is reduced by pressing the mold against the substrate after depressurizing the atmosphere between the mold and the substrate, or by causing the atmosphere between the mold and the substrate to be a vacuum. However, there is a possibility that the photocuring resin will volatilize before curing in a vacuum environment, causing difficulties in maintaining a uniform film thickness. Therefore, it is preferable to reduce the amount of residual gas by causing the atmosphere between the substrate and the mold to be a He atmosphere or a depressurized He atmosphere. He passes through the quartz substrate, and therefore the amount of residual gas (He) will gradually decrease. As the passage of He through the quartz substrate takes time, it is more preferable for the depressurized He atmosphere to be employed.

The mold is pressed against the substrate at a pressure within a range from 100 kPa to 10 MPa. The flow of the resin is promoted, the residual gas is compressed, the residual gas dissolves into the photocuring resin, and the passage of He through the quartz substrate is promoted as the pressure is greater. However, if the pressure is excessive, there is a possibility that the mold and the substrate will be damaged if a foreign object is interposed between the mold and the substrate when the mold contacts the substrate. Accordingly, it is preferable for the pressure to be within a range from 100 kPa to 10 MPa, more preferably within a range from 100 kPa to 5 MPa, and most preferably within a range from 100 kPa to 1 MPa. The reason why the lower limit of the pressure is set to 100 kPa is that in the case that the space between the mold and the substrate is filled with liquid when performing imprinting within the atmosphere, the space between the mold and the substrate is pressurized by atmospheric pressure (approximately 101 kPa).

(Mold Release Step)

After the mold is pressed against the substrate and the photocuring resin film is formed, the mold is separated from the photocuring resin film. As an example of a separating method, the outer edge portion of one of the mold and the substrate may be held, while the rear surface of the other of the mold and the substrate is held by vacuum suction, and the held portion of the outer edge or the held portion of the rear surface is relatively moved in a direction opposite the pressing direction.

As described above, the first nanoimprinting method of the present invention, the droplets are coated on the substrate such that the spaces among droplets in the A direction substantially parallel to the direction of the lines of the linear pattern of protrusions and recesses are longer than the spaces among droplets in the B direction substantially perpendicular to the A direction. That is, the droplets are arranged taking the direction of the lines into consideration. Therefore, the droplets can be spread evenly, even if anisotropy occurs in the spreading direction of the droplets due to the pattern shape of the linear pattern of protrusions and recesses. As a result, fluctuations in thickness of residual resist film, on which a pattern of protrusions and recesses has been transferred, and defects due to residual gas, can be suppressed in a nanoimprinting method that performs nanoimprinting after coating a substrate with droplets of resist material using the ink jet method.

[Second Nanoimprinting Method]

Next, an embodiment of a second nanoimprinting method of the present invention will be described. Note that this embodiment will also be described as an example in which photocuring nanoimprinting that cures a resist film with light is employed. The present embodiment differs from the previously described embodiment in the points that the linear pattern of protrusions and recesses is a straight linear pattern of protrusions and recesses, and that the droplet arrangement pattern is constituted by a two dimensional coordinate system constituted by groups of periodic lattice points. Accordingly, detailed descriptions regarding the other constituent elements which are the same as those of the previously described embodiment will be omitted insofar as they are not particularly necessary.

In the second nanoimprinting method, a quartz substrate is coated with a plurality of droplets that contain photocuring resin by the ink jet method according to a droplet arrangement pattern having basic unit lattices having periodicity in each of an A direction substantially parallel to the direction of the lines of the straight linear pattern of protrusions and in a B direction substantially perpendicular to the A direction, and in which the periods of the periodicity in the A direction are longer than the periods of the periodicity in the B direction, within a straight line transfer region of the quartz substrate that faces the straight linear pattern of protrusions and recesses of an Si mold. Then, the straight linear pattern of protrusions and recesses of the Si mold is pressed onto the surface of the quartz substrate which is coated with the droplets, to spread the droplets on the quartz substrate thereby forming a photocuring resin film constituted by bonds among the spread plurality of droplets. Thereafter, the photocuring resin film is exposed to ultraviolet rays from the side of the quartz substrate to cure the photocuring resin film. Finally, the Si mold is separated from the photocuring resin film after it cures, to transfer the straight linear pattern of protrusions and recesses onto the photocuring resin film.

FIG. 10 is a diagram that schematically illustrates a droplet arrangement pattern in a second nanoimprinting method. The droplet arrangement patter of the present embodiment has two dimensional coordinate information, constituted by a plurality of lattice points L which are arranged periodically. In other words, the droplet arrangement pattern of has basic unit lattices U having periodicity in both the A direction and the B direction. In the present embodiment, the periods of the periodicity of the basic unit lattice U in the A direction and the B direction correspond to the spaces among droplets in the A direction and the B direction of the previously described embodiment. A period Ta of the periodicity in the A direction is set to be longer than a period Tb of the periodicity in the B direction. With respect to the periodicity of the basic unit lattice U, it is preferable for a ratio Ta/Tb between a length Ta of a single period in the A direction and a length Tb of a single period in the B direction to satisfy the following formula (2). The upper and lower limits are the same as those of Formula (1) described previously. However, V in Formula (2) V represents the average volume of droplets corresponding to representative lattice points of the basic unit lattice U. Here, the representative lattice points of the basic unit lattice U refers to lattice points of which the total volume of the droplets corresponding thereto constitute a predetermined value (90% or greater) of the total volume of the droplets corresponding to all lattice points within the unit basic lattice U. It is not necessary for the representative lattice point to be a single point.

$$1.8 \leq Ta/Tb \leq 0.52 V^{1/3}/d \quad (2)$$

The designation of the basic unit lattice U is not particularly limited. For example, in FIG. 10, a parallelogram formed by a vector a and a vector b of lengths corresponding to a single period of the periodicity in the A direction and the B direction, respectively, is designated as the basic unit lattice U.

Considering the objective of suppressing fluctuations in thickness and defects due to residual gas, as well as filling rates, it is preferable for unit structures that constitute the basic unit lattice to include a single lattice point $L1=0\cdot a + 0\cdot b$, or the lattice point L1 and another lattice point $L2=\frac{1}{2}\cdot a + \frac{1}{2}\cdot b$. Here, a and b represent the vectors a and b. FIG. 11A is a diagram that schematically illustrates the outer edges of spread droplets in the case that there are two lattice points within a unit structure. FIG. 11B is a diagram that schematically illustrates the outer edges of spread droplets in the case that there is one lattice point within a unit structure. As illustrated in FIG. 11A and FIG. 11B, the resist film can be formed more efficiently by arranging the droplets at points L1 and L2, even if the same number of droplets are coated. In addition, it is not necessary for the amounts of resist in all of the droplets within the basic unit lattice U to be equal. For example, droplets of amounts that form the majority of the resist film may be arranged at the points L1, while droplets of amounts to a degree that merely fill in the gaps therebetween may be arranged at the points L2.

In the second nanoimprinting method of the present embodiment, it is preferable for the resolution in the A direction which is defined by the ink jet head that performs the coating with the droplets to be set lower than the resolution in the B direction which is defined by the ink jet head.

In the second nanoimprinting method of the present invention, it is preferable for: one of the A direction and the B direction to be set as a main scanning direction in the ink jet method, and the other to be set as a sub scanning direction in the ink jet method; and for the ink jet head to be set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged. Note that details regarding the settings of the ink jet head will be described later.

In the second nanoimprinting method of the present embodiment, the droplets are coated onto the straight line transfer region of the substrate according to the droplet arrangement pattern. The droplet arrangement pattern has the basic unit lattices having periodicity in both the A direction, which is substantially parallel to the direction of the lines of the linear pattern of protrusions and recesses, and the B direction, which is substantially perpendicular to the B direction. The periods of the periodicity in the A direction are longer than the periods of the periodicity in the B direction, that is, the droplets are arranged taking the direction of the lines into consideration. Therefore, the second nanoimprinting method exhibits the same advantageous effects as those exhibited by the first nanoimprinting method.

[Third Nanoimprinting Method and Method for Producing the Droplet Arrangement Pattern Employed Therein]

Next, an embodiment of a third nanoimprinting method of the present invention will be described. Note that this embodiment will also be described as an example in which photocuring nanoimprinting that cures a resist film with light is employed. The present embodiment differs from the first embodiment in the point that a method for producing a droplet arrangement pattern of the present invention is executed, and that droplets are coated on a substrate according to a droplet arrangement pattern produced thereby. Accordingly, detailed descriptions regarding the other constituent elements which are the same as those of the previously described embodiment will be omitted insofar as they are not particularly necessary.

In the third nanoimprinting method, a quartz substrate is coated with a plurality of droplets that contain photocuring resin by the ink jet method according to a droplet arrangement pattern produced by a method for producing a droplet arrangement pattern of the present embodiment, within a line transfer region of the quartz substrate that faces a linear pattern of protrusions and recesses of an Si mold. Then, the linear pattern of protrusions and recesses of the Si mold is pressed onto the surface of the quartz substrate which is coated with the droplets, to spread the droplets on the quartz substrate thereby forming a photocuring resin film constituted by bonds among the spread plurality of droplets. Thereafter, the photocuring resin film is exposed to ultraviolet rays from the side of the quartz substrate to cure the photocuring resin film. Finally, the Si mold is separated from the photocuring resin film after it cures, to transfer the linear pattern of protrusions and recesses onto the photocuring resin film.

Meanwhile, the method for producing the droplet arrangement pattern of the present embodiment comprises the steps of: coating a plurality of droplets that contain the photocuring resin at a standard amount onto a second quartz substrate different from the aforementioned quartz substrate; pressing a second Si mold having a pattern of protrusions and recesses, which is the same as the linear pattern of protrusions and recesses, against the surface of the second quartz substrate which is coated with the droplets, to spread the droplets to a degree that the droplets contact each other; causing the shapes of the spread droplets of the standard amount to approximate ellipses; measuring the arrangement of the ellipses; rearranging the arrangements of the measured ellipses such that the plurality of ellipses are closely packed; and obtaining a droplet arrangement pattern constituted by a plurality of lattice points that correspond to positions at which the plurality of droplets are to be arranged, by designating the centers of each of the rearranged plurality of ellipses as lattice points.

In the present specification, the expression "standard amount" refers to an approximate amount of resist material within each droplet, when coating the first substrate with the plurality of droplets of resist material. Based on common expulsion performance of ink jet printers, the standard amount is within a range from 1 pl to 1000 pl.

The droplet arrangement pattern is produced by the method for producing a droplet arrangement pattern of the present embodiment, based on the two dimensional shapes of the droplets which are spread during nanoimprinting.

The specific method and concept behind the method for producing the droplet arrangement pattern are as follows. In the case that droplets are already spread by a mold having a linear pattern of protrusions and recesses, the droplets spread along the direction of the lines thereof. Therefore, the two dimensional shapes of the spread droplets approximate ellipses. However, these two dimensional shapes depend greatly on the design of the pattern of the mold and on conditions regarding the droplets which are utilized, and vary in a complex manner. For example, the two dimensional shapes of spread droplets vary according to the shape of a pattern (the height, the width, the pitch, the inclination angle, etc. of the pattern), the two dimensional arrangement of the pattern (straight lines, curved lines, the repetitive structure of dots, whether dots and lines coexist), the coating conditions of droplets (volume per droplet, coating density, etc.), and the liquid properties of the droplets (viscosity, surface tension, etc.). Therefore, in the present embodiment, a test procedure, in which nanoimprinting is performed using a mold having the same pattern of protrusions and recesses, is executed to determine droplet arrangement conditions, prior to performing nanoimprinting employing a mold having a predetermined pattern of protrusions and recesses. Thereby, a droplet arrangement pattern suited for executing nanoimprinting is produced.

The test procedure is performed by the following steps, for example. (1) A reference droplet arrangement pattern (a pattern in which droplets are arranged at lattice points of square lattices or triangular lattices, for example) is produced, and two dimensional shapes are repeatedly measured while gradually varying the amount of resin in the droplets within the range of the standard amount. (2) Two dimensional shapes are repeatedly measured while gradually varying the spaces among droplets, which contain a reference amount of resin within the range of the standard amount, within arrangement patterns. By repeating steps (1) and/or (2), conditions in which adjacent droplets which are spread by the test mold do not contact each other are derived. The method for measuring the two dimensional shapes is not particularly limited, and an optical method or a stylus method may be employed. For example, an optical microscope may be employed to obtain two dimensional images of the shapes, and the shapes may be measured by image processes. In addition, the measurement of the two dimensional images may be performed in a state in which the mold is pressed against the test substrate, or in a state in which the mold is separated from the test substrate. This is because the shapes of the droplets do not change much between these two states if the droplets have been cured by exposure to light. The measured two dimensional shapes approximate ellipses by image processes. The approximation method is not particularly limited, but commonly, there are many cases in which the method of least squares is employed. Then, a two dimensional arrangement in which the ellipses are most closely packed is derived, by rearranging the arrangements of the approximated ellipses (FIG. 12). Here, the most closely packed arrangement refers to a case in which the area occupied by the ellipses within the two dimensional image is 70% or greater. Finally, the central coordinates of the ellipses within the two dimensional arrangement are extracted, and two dimensional coordinates of a droplet arrangement having the coordinates as lattice points are obtained. Note that the aforementioned steps result in two dimensional coordinates of a droplet arrangement (droplet arrangement pattern) that considers the direction of the lines of the linear pattern of protrusions and recesses. Therefore, in the case that nanoimprinting is actually performed using this droplet arrangement pattern, it is necessary to finely adjust the amounts of resin in the droplets according to actual droplet coating conditions.

In the third nanoimprinting method of the present invention, it is preferable for the resolution in the direction of the long axes of the ellipses which is defined by an ink jet head that performs the coating with the droplets to be set lower than the resolution in the direction of the short axes of the ellipses which is defined by the ink jet head.

In the third nanoimprinting method of the present invention, it is preferable for one of the direction of the long axes and the direction of the short axes to be set as a main scanning direction in the ink jet method, and the other to be set as a sub scanning direction in the ink jet method; and for the ink jet head to be set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged. Note that details regarding the settings of the ink jet head will be described later.

As described above, in the third nanoimprinting method of the present invention, the droplets are coated on the substrate according to the droplet arrangement pattern produced by the method for producing a droplet pattern of the present invention. The droplets are arranged taking the direction of the lines into consideration. Therefore, the third nanoimprinting method exhibits the same advantageous effects as those exhibited by the first nanoimprinting method.

Further, the method for producing a droplet arrangement pattern of the present invention comprises the steps of: coating a plurality of droplets of resist material at a standard amount onto a test substrate; pressing a test mold having a pattern of protrusions and recesses, which is at least partially the same as the linear pattern of protrusions and recesses, against the surface of the test substrate which is coated with the droplets, to spread the droplets to a degree that the droplets contact each other; causing the shapes of the spread droplets of the standard amount to approximate ellipses; measuring the arrangement of the ellipses; rearranging the arrangements of the measured ellipses such that the plurality of ellipses are closely packed; and obtaining a droplet arrangement pattern constituted by a plurality of lattice points that correspond to positions at which the plurality of droplets are to be arranged, by designating the centers of each of the rearranged plurality of ellipses as lattice points. As a result, a droplet arrangement pattern that takes the direction of the lines of the linear pattern of protrusions and recesses into consideration is obtained. Thereby, fluctuations in thickness of residual resist film, on which a pattern of protrusions and recesses has been transferred, and defects due to residual gas, can be suppressed in a nanoimprinting method that performs nanoimprinting after coating a substrate with droplets of resist material using the ink jet method, by utilizing the droplet arrangement pattern produced in this manner.

<Design Modifications>

The embodiments of the first through third nanoimprinting methods and the method for producing a droplet arrangement pattern above have been described as cases in which photocuring nanoimprinting that cures resist films with light is employed. However, the present invention is not limited to such a configuration, and may also be applied to thermal curing nanoimprinting that employs thermal curing resin.

[Method for Setting Ink Jet Head in the Nanoimprinting Methods of the Present Invention]

In the present embodiment, a case will be described in which the resolution in the A direction which is defined by an ink jet head that performs the coating with the droplets is set to be lower than the resolution in the B direction which is defined by the ink jet head. Note that with respect to the third nanoimprinting method of the present invention, the "A direction" and the "B direction" designate the "direction of the long axes" and the "direction of the short axes" of the rearranged ellipses, respectively.

Figure 13A:
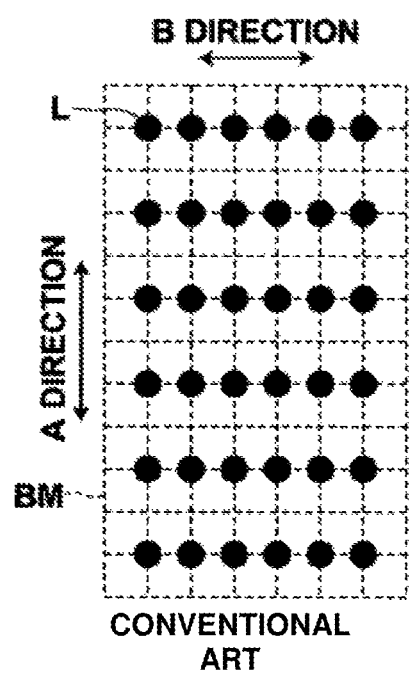
FIG. 13A is a diagram that schematically illustrates the relationship between resolution and a droplet arrangement pattern in a conventional ink jet method.
Figure 13B:
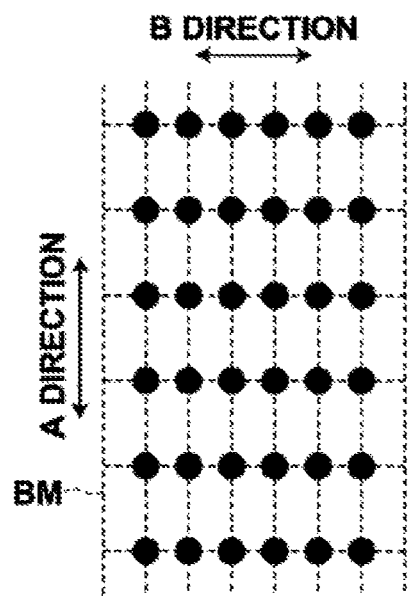
FIG. 13B is a diagram that schematically illustrates the relationship between resolution and a droplet arrangement pattern in an ink jet method of the present invention.

The expression "resolution . . . which is defined by an ink jet head" refers to indices of arrangement performance (the fineness of a grid to be described later) that indicate at what density droplets can be arranged. These indices are determined by the intervals among ink expelling outlets, the expulsion frequency, and the scanning speed of the ink jet head. FIG. 13A is a diagram that schematically illustrates the relationship between resolution and a droplet arrangement pattern in a conventional ink jet method. FIG. 13B is a diagram that schematically illustrates the relationship between resolution and a droplet arrangement pattern in an ink jet method of the present invention. In the figures, BM denotes a map (bitmap) of a grid in which droplets can be arranged by an ink jet printer, and L denotes lattice points that correspond to the positions at which the droplets are arranged. The ink jet method is executed by the ink jet head scanning each grid of the bit map BM on the substrate while referring to the droplet arrangement pattern, and coating droplets onto portions of the grid that correspond to the lattice points L of the droplet arrangement pattern.

In the conventional drop on demand method, arrangements that maximize droplet arrangement density are said to be preferable. Accordingly, as illustrated in FIG. 13A, the resolution of the bitmap is high (the grids are small), and the resolution is set to be equal in both the main scanning direction and the sub scanning direction. However, droplets spread anisotropically when they contact patterns having anisotropy, such as a linear pattern of protrusions and recesses. That is, in such cases, the drop on demand method that assumes isotropic spreading of droplets is not effective.

On the other hand, it is not necessary for the resolution to be the same in the A direction and the B direction within regions in which the intervals among lattice points of the droplet arrangement pattern are longer in the A direction than in the B direction, in the nanoimprinting methods of the present invention. Further, it is not necessary to perform finer scanning in the A direction than in the B direction. Therefore, maximization of the droplet arrangement density, which had heretofore been considered necessary, is purposely not performed in the nanoimprinting methods of the present invention, and resolution, which had been at excessive performance levels, is reduced. Thereby, the throughput of the droplet coating process can be improved. More specifically, the shape of the grids of the bitmap BM are set as rectangles which are long in the A direction as illustrated in FIG. 13B, and the resolution in the A direction is set to be less than the resolution in the B direction. By setting the resolution in this manner, throughput during droplet discharge can be improved, while maintaining the resolution performance of the ink jet printer as a whole, because necessary resolution is maintained in the B direction, while obviating fine scanning in the A direction.

Note that the main scanning direction in the ink jet method may be either one of the A direction and the B direction. In the case that the A direction is the main scanning direction, the main scanning speed can be accelerated because the resolution in the main scanning direction is low. As a result, the amount of time required for coating during each scanning operation is reduced, and the total coating time can be reduced. In the case that the B direction is the main scanning direction, the resolution in the stage feeding direction is low, and therefore the number of scanning operations in the sub scanning direction can be reduced. As a result, the total coating time can be reduced.

As described above, the nanoimprinting methods of the present invention may adopt a configuration, wherein: the resolution in the A direction which is defined by an ink jet head that performs the coating with the droplets is set to be lower than the resolution in the B direction which is defined by the ink jet head. In this case, throughput during droplet discharge can be improved, while maintaining the resolution performance of the ink jet printer as a whole.

Next, a case will be described, in which one of the A direction and the B direction is set as a main scanning direction in the ink jet method, and the other is set as a sub scanning direction in the ink jet method; and the ink jet head is set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged.

In the present specification, the expression "intervals among lattice points along the sub scanning direction" refers to the smallest distance in the sub scanning direction between a lattice point and another lattice point. That is, in the case of a droplet arrangement pattern having L1 and L2 as a unit structure as illustrated in FIG. 10, the intervals among lattice points along the sub scanning direction is half the period which is set along the sub scanning direction. In addition, the expression "effective intervals among ink expelling outlets" refers to the smallest distance in the sub scanning direction between an ink expelling outlet and another ink expelling outlet. Accordingly, the effective intervals among ink expelling outlets" in the case that the expelling outlets are provided in a row with predetermined arrangement intervals therebetween, the effective intervals are equal to the arrangement intervals.

Figure 14A:
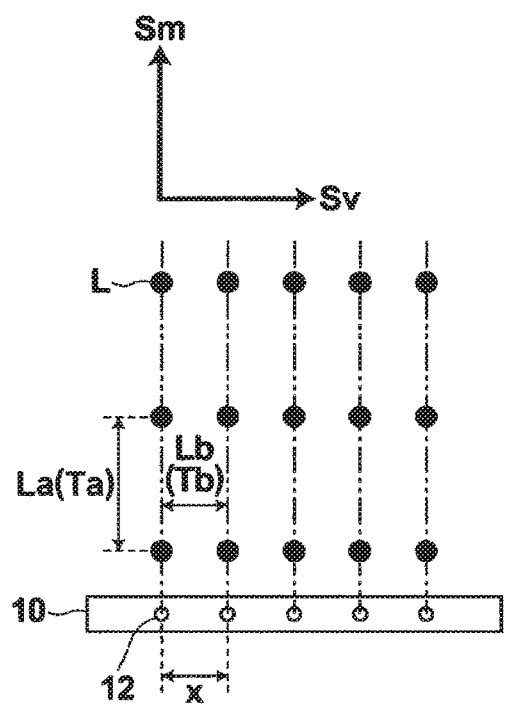
FIG. 14A is a first schematic diagram for explaining the relationship among the intervals among lattice points along a sub scanning direction, the arrangement interval among ink expelling outlets, and effective intervals among ink expelling outlets.
Figure 14B:
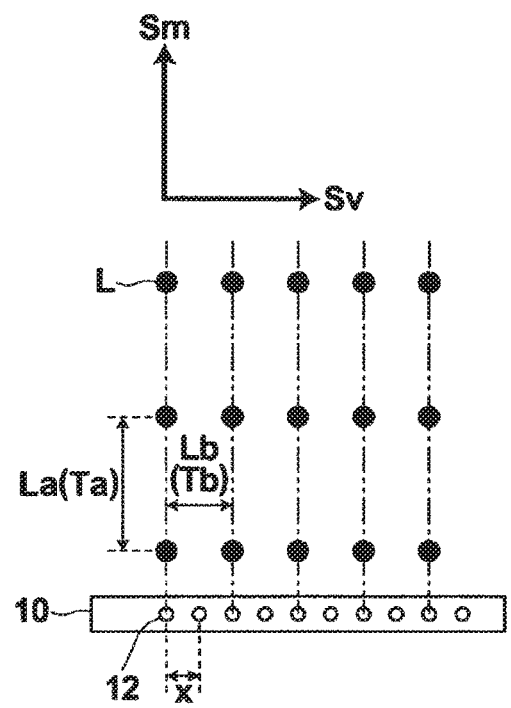
FIG. 14B is a second schematic diagram for explaining the relationship among the intervals among lattice points along a sub scanning direction, the arrangement interval among ink expelling outlets, and effective intervals among ink expelling outlets.
Figure 14C:
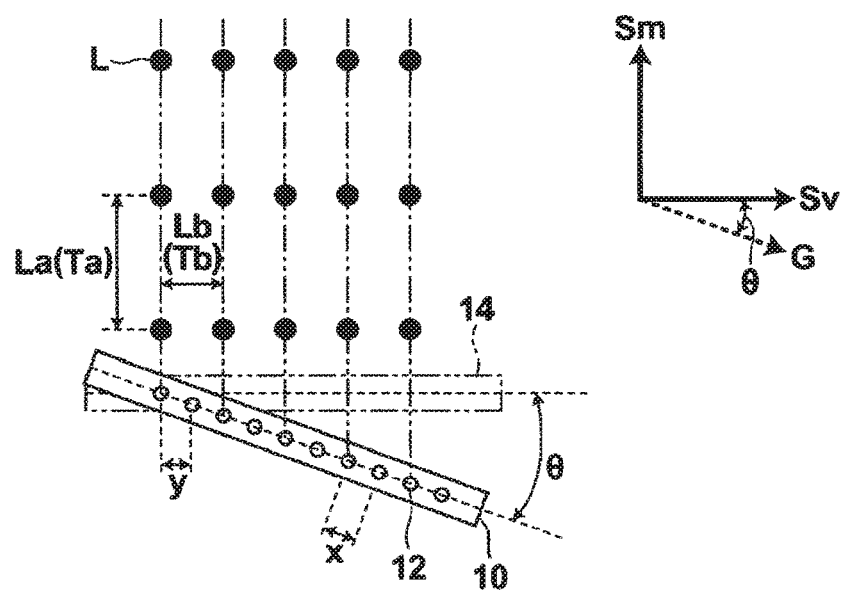
FIG. 14C is a third schematic diagram for explaining the relationship among the intervals among lattice points along a sub scanning direction, the arrangement interval among ink expelling outlets, and effective intervals among ink expelling outlets.

Specifically, setting of the ink jet head described above is executed in the following manner. FIG. 14A through FIG. 14C are schematic diagrams for explaining the relationship among the intervals among lattice points along a sub scanning direction, the arrangement interval among ink expelling outlets, and effective intervals among ink expelling outlets. Note that in FIG. 14A through FIG. 14C, the A direction is designated as a main scanning direction Sm, and the B direction is designated as a sub scanning direction Sv. In addition, the intervals among lattice points match the period of the lattice points in FIG. 14A through FIG. 14C.

FIG. 14A illustrates a case in which intervals Lb among lattice points L along the sub scanning direction Sv and arrangement intervals x of ink expelling outlets 12 of an ink jet head 10 are matched. Meanwhile, FIG. 14B illustrates a case in which intervals Lb among lattice points L along the sub scanning direction Sv and arrangement intervals x of ink expelling outlets 12 of an ink jet head 10 have the relationship Lb=2x. That is, as described above, an ink jet head having an arrangement interval x that satisfies the relationship Lb=nx (n is a positive integer) with respect to the intervals among lattice points Lb may be selected. In the case that the arrangement interval x does not satisfy the above relationship, the arrangement direction of the ink expelling outlets may be inclined by an angle θ with respect to the sub scanning direction, to adjust effective intervals y among the ink expelling outlets such that the relationship Lb=ny (n is a positive integer) is satisfied. In such a case, x and y have the relationship y=x·cos θ. Here, the angle θ is an acute angle formed between the sub scanning direction Sv and a direction G of the inclined ink jet head.

In addition, an ink jet head 10 provided with a plurality of rows of ink expelling outlets may also be utilized. For example, FIG. 15A and FIG. 15B are schematic diagrams for explaining arrangement intervals among ink expelling outlets and effective intervals among ink expelling outlets in the case that the ink expelling outlets of an ink jet head are arranged in a plurality of rows. The ink jet heads 10 of FIG. 15A and FIG. 15B are constituted by ink jet heads 10a and 10b, each of which has ink expelling outlets arranged with predetermined intervals therebetween. In these cases, whether ink expelling outlets (12a and 12b) are in the same or different rows is not taken into consideration. That is, the arrangement intervals x among the ink expelling outlets of such ink jet heads 10 are the intervals among the ink expelling outlets 12a of the ink jet head 10a and the ink expelling outlets 12b of the ink jet head 10b along the sub scanning direction Sv (FIG. 15A). In the case that the rows of ink expelling outlets are inclined with respect to the sub scanning direction Sv, the effective intervals y among the ink expelling outlets are the intervals among the ink expelling outlets 12a of the ink jet head 10a and the ink expelling outlets 12b of the ink jet head 10b along the sub scanning direction Sv (FIG. 15B).

As described above, in the case that the intervals among lattice points along the sub scanning direction are not integer multiples of the effective intervals among the ink expelling outlets of the ink jet head along the sub scanning direction, it is necessary to perform repeated scanning operations with different settings, and a great number of scanning operations will become necessary. However, by setting the ink jet head such that the intervals among lattice points along the sub scanning direction are integer multiples of the effective intervals among the ink expelling outlets of the ink jet head along the sub scanning direction, droplets can be coated efficiently, and throughput during droplet expulsion can be improved further.

In addition, in the case that there are regions having different intervals among lattice points, the greatest common denominator of the intervals among lattice points may be set as the arrangement interval x (or the effective interval y) among ink expelling outlets along the sub scanning direction. Thereby, such regions can be coated with droplets with a single scanning operation.

As described above, the nanoimprinting methods of the present invention may adopt configurations in which: one of the A direction and the B direction to be set as a main scanning direction in the ink jet method, and the other to be set as a sub scanning direction in the ink jet method; and the ink jet head to be set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged. In this case, the droplets can be coated efficiently, and throughput during droplet expulsion can be improved further.

[Method for Producing a Substrate]

Next, an embodiment of a method for producing a substrate of the present invention will be described. The present embodiment will be described as a case in which a substrate is produced by the first nanoimprinting method described previously, employing a Si mold an original plate.

First, a resist film, on which a pattern has been transferred by the first nanoimprinting method, is formed on a surface of a substrate. Then, dry etching is performed using the resist film having the transferred pattern as a mask, to form a pattern of protrusions and recesses corresponding to the pattern of protrusions and recesses of the resist film. Thereby, a substrate having a predetermined pattern is obtained.

In the case that the substrate is of a layered structure and includes a metal layer on the surface thereof, dry etching is performed using the resist film as a mask, to form a pattern of protrusions and recesses corresponding to the pattern of protrusions and recesses of the resist film in the metal layer. Thereafter, dry etching is further performed with the thin metal layer as an etching stop layer, to form a pattern of protrusions and recesses in the substrate. Thereby, a substrate having a predetermined pattern is obtained.

The dry etching method is not particularly limited as long as it is capable of forming a pattern of protrusions and recesses in the substrate, and may be selected according to specific objectives. Examples of dry etching methods that may be employed include: the ion milling method; the RIE (Reactive Ion Etching) method; the sputter etching method; etc. From among these methods, the ion milling method and the RIE method are particularly preferred.

The ion milling method is also referred to as ion beam etching. In the ion milling method, an inert gas such as Ar is introduced into an ion source, to generate ions. The generated ions are accelerated through a grid and caused to collide with a sample substrate to perform etching. Examples of ion sources include: Kauffman type ion sources; high frequency ion sources; electron bombardment ion sources; duoplasmatron ion sources; Freeman ion sources; and ECR (Electron Cyclotron Resonance) ion sources.

Ar gas may be employed as a processing gas during ion beam etching. Fluorine series gases or chlorine series gases may be employed as etchants during RIE.

As described above, the method for producing a substrate of the present invention performs dry etching, using the resist film onto which a pattern is transferred by the nanoimprinting method of the present invention as a mask. That is, a mask free of fluctuations in the thickness of a residual layer and also free from defects due to residual gas is employed to perform dry etching. Therefore, it becomes possible to produce substrates highly accurately at high yield.

<Design Modifications>

Note that the embodiment of the method for producing a substrate described above was described as an example in which the resist film formed by the first nanoimprinting method was employed as the mask. However, the present invention is not limited to this configuration, and a resist film formed by the second or the third nanoimprinting method may alternatively be employed as the mask.

Hereinafter, embodiments of the present invention will be described.

[Embodiment 1]

(Production of Si Mold)

First, a Si substrate was coated with a photoresist liquid having PMMA (polymethyl methacrylate) as a main component by the spin coat method, to form a photoresist layer. Thereafter, an electron beam, which was modulated according to a concentric pattern having a line width of 100 nm and a pitch of 200 nm, was irradiated onto the photoresist layer while rotating the Si substrate, to expose the concentric pattern within a range from a radius of 15 mm to 30 mm. Thereafter, the photoresist layer underwent a development process and the exposed portions were removed. Finally, selective etching was performed to a depth of 80 nm by RIE using the photoresist layer, from which the exposed portions were removed, as a mask, to obtain a first Si mold having the concentric pattern.

(Photocuring Resin)

The aforementioned photocuring resin, prepared by adding a photopolymerization initiator (2% by mass), a surfactant W-1 (0.1% by mass), a surfactant W-2 (0.04% by mass), an antioxidant A-1 (1% by mass), and an antioxidant A-2 (1% by mass) to a polymerizable compound R-1, was employed.

(Substrate)

The surface of a 0.525 mmthick quartz wafer was processed with KBM-5103 (by Shin-Etsu Chemical Industries, K.K.), which is a silane coupling agent having superior close contact properties with respect to the photocuring resin. The KBM-5103 was diluted to 1% by mass using PGMEA (Propylene Glycol Monomethyl Ether Acetate), and coated on the surface of the substrate by the spin coat method. Thereafter, the coated substrate was annealed for 20 minutes at 120° C. on a hot plate, causing the silane coupling agent to bond to the surface of the substrate.

(Photocuring Resin Coating Step)

DMP-2831, which is an ink jet printer of the piezoelectric type by FUJIFILM Dimatix, was utilized. DMC-11610, which is a dedicated 10 pl head, was utilized as an inkjet head. Ink expelling conditions were set and adjusted in advance such that the amount of resin in each droplet was 10 pl. A droplet arrangement pattern was produced by the method for producing a droplet arrangement pattern of the present invention. The spaces among droplets Wa and Wb in the droplet arrangement pattern were 1000 μm and 250 μm, respectively. Then, the ink expelling conditions were set and adjusted in advance, and droplets were arranged in a line transfer region according to the droplet arrangement pattern.

(Si Mold Pressing Step)

The droplet arrangement pattern and the pattern of protrusions and recesses of the Si mold. Specifically, the Si mold and the quartz substrate were caused to approach each other such that the gap therebetween was 0.1 mm or less. Next, the droplet arrangement pattern and the pattern of protrusions and recesses of the mold were observed with a microscope from the underside of the quartz substrate, and the Si mold or a stage that the quartz substrate was placed on was moved such that the positions thereof matched. The space between the Si mold and the quartz substrate was replaced with a gas which is 99% He by volume or greater. Then, depressurization was performed to 50 kPa, to form a depressurized He environment. The Si mold was caused to contact the droplets under the depressurized He conditions. After contact, the manner in which the droplets spread was observed with a microscope from the underside of the quartz substrate, and an image of the elliptical shapes during the droplet spreading process was obtained. The contact state was maintained for one minute, and ultraviolet light including a wavelength of 360 nm as irradiated at a dosage of 300 mJ/cm$^2$, to cure the photocuring resin.

(Si Mold Release Step)

The outer edge portion of the quartz substrate was held, and the Si mold was relatively moved in a direction opposite the pressing direction while the rear surface of the Si mold was held by vacuum suction, to release and separate the Si mold. Thereby, a first photocuring resin film, on which the pattern of protrusions and recesses is transferred, was obtained.

(Quartz Substrate Processing Step)

Dry etching was performed as described below using the photocuring resin film, on which the pattern of protrusions and recesses is transferred, as a mask. Thereby, shapes of protrusions and recesses based on the pattern of protrusions and recesses of the photocuring resin film were formed on the quartz substrate, to obtain a first quartz mold having a predetermined pattern of protrusions and recesses. First, the residual layer present at the recesses of the pattern was removed by oxygen plasma etching, to expose the quartz substrate at the recesses of the pattern. At this time, conditions were set such that the amount of etching is capable of removing the thickest residual layer within the region of the pattern of protrusions and recesses. Next, RIE using a fluorine series gas was administered on the quartz substrate, using the protrusions of the pattern as a mask. The RIE conditions were set such that the depth of etching was 80 nm. Finally, the residue of the protrusions of the pattern was removed by oxygen plasma etching.

[Embodiment 2]

(Production of Si Mold)

An electron beam, which was modulated according to a straight linear pattern of protrusions and recesses having a line width of 100 nm and a pitch of 200 nm, was irradiated onto the entire surface of a 10 mm square photoresist layer while rotating the Si substrate, to expose the straight linear pattern of protrusions and recesses. Thereafter, the same steps as those described with respect to Embodiment 1 were performed, to obtain a second Si mold having the straight linear pattern of protrusions and recesses.

The second Si mold was employed to execute the same steps as those described with respect to Embodiment 1, to obtain a second photocuring resin film on which the pattern of protrusions and recesses was transferred, and a second quartz mold having a predetermined pattern of protrusions and recesses.

COMPARATIVE EXAMPLE 1

The same steps as those described with respect to Embodiment 1, except that the spaces among droplets Wa and Wb were both 500 μm, were executed, to obtain a photocuring resin film on which a pattern of protrusions and recesses was transferred, and a quartz mold having a predetermined pattern of protrusions and recesses.

COMPARATIVE EXAMPLE 2

The same steps as those described with respect to Embodiment 2, except that the spaces among droplets Wa and Wb were both 500 μm, were executed, to obtain a photocuring resin film on which a pattern of protrusions and recesses was transferred, and a quartz mold having a predetermined pattern of protrusions and recesses.

(Evaluation Method)

The patterns of protrusions and recesses of the photocuring resin films obtained by Embodiments 1 and 2 as well as Comparative Examples 1 and 2 were inspected by performing dark field measurements with an optical microscope (magnification: 50× to 1500×).

First, 2 mm square fields were defined at a magnification of 50×. Next, the measurement fields were scanned, to ascertain the presence of defects due to residual gas. Defects due to residual gas were judged to be present in cases that scattered light, which should not be present in a normal pattern, was observed. The total number of defects due to residual gas was counted. In the case that the number of defects per 1 cm square area was 0, it was judged that no defects were present (GOOD). In the case that the number of defects per 1 cm square area was 1 or more, it was judged that defects were present (POOR).

Next, the thicknesses of the residual layers of the photocuring resin films were measured. The substrates were exposed by scratching or removing portions of the patterned regions of the photocuring resin films, and the thicknesses of the residual layers were measured by measuring the boundary portions between the removed portions and the pattern regions by an AFM (Atomic Force Microscope). The thicknesses of the residual layers were measured at 10 locations within each pattern region, and it was judged that fluctuations in film thickness were not present (GOOD) in cases that the standard deviation among the 10 measured values was less than 20 nm, and that fluctuations in film thickness were present (POOR) in cases that the standard deviation among the 10 measured values was 20 nm or greater.

The patterns of protrusions and recesses of the quartz molds of Embodiments 1 and 2 as well as Comparative Examples 1 and 2 were also inspected by performing dark field measurements with an optical microscope (magnification: 50× to 1500×).

(Evaluation Results of Embodiments 1 and 2)

As illustrated in Table 1, the photocuring resin films of Embodiments 1 and 2 accurately reflected the patterns of protrusions and recesses of the Si molds without defects or fluctuations in the thicknesses of the residual layers. In addition, quartz molds having uniform line widths and pattern heights were obtained, and it was confirmed that the present invention is capable of producing favorable substrates.

TABLE 1

| | Pattern Type | Spaces Among Droplets | | Evaluation Results | |
|---|---|---|---|---|---|
| | | Wa (μm) | Wb (μm) | Defects | Thickness |
| Embodiment 1 | Linear | 1000 | 250 | GOOD | GOOD |
| Comparative Example 1 | Linear | 500 | 500 | POOR | POOR |
| Embodiment 2 | Straight Linear | 1000 | 250 | GOOD | GOOD |
| Comparative Example 2 | Straight Linear | 500 | 500 | POOR | POOR |

[Embodiment 3]

An Si mold was produced in the same manner as in Embodiment 2, a photocuring resin and a substrate were prepared in the same manner as Embodiment 2, and the following coating step was executed. Thereafter, an evaluation was performed regarding the amount of coating time necessary to coat droplets.

(Photocuring Resin Coating Step)

DMP-2831, which is an ink jet printer of the piezoelectric type by FUJIFILM Dimatix, was utilized. DMC-11601, which is a dedicated 1 pl head, was utilized as an ink jet head. Ink expelling conditions were set and adjusted in advance such that the amount of resin in each droplet was 1 pl. A droplet arrangement pattern was produced by the method for producing a droplet arrangement pattern of the present invention. The intervals among lattice points La and Lb in the droplet arrangement pattern along the A direction and the B direction were 316 µm and 79 µm, respectively.

DMC-11601 is provided with 16 ink expelling outlets at intervals of 254 µm therebetween. Because the intervals among lattice points of the droplet arrangement pattern is less than 254 µm or less, the head is rotated for an angle $\theta_1$ with respect to the sub scanning direction, to change the effective intervals among adjacent ink expelling outlets along the sub scanning direction to a desired distance. Note that in the case that the intervals among lattice points of the droplet arrangement pattern is greater than 254 µm, the ink expelling outlets to be utilized may be thinned, or the effective intervals among adjacent ink expelling outlets is adjusted by rotating the head such that the effective intervals become desired values. The effective intervals among ink expelling outlets of the ink jet head was adjusted to become an integer multiple of the intervals among lattice points in the sub scanning direction as described above.

Figure 16A:
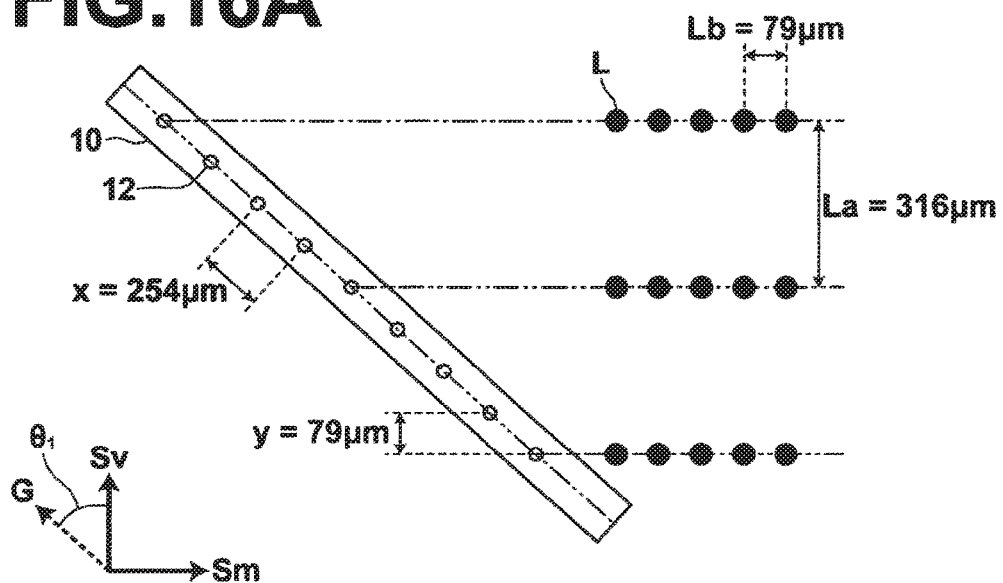
FIG. 16A is a schematic diagram for explaining the relationship among the intervals among lattice points along a sub scanning direction, the arrangement interval among ink expelling outlets, and effective intervals among ink expelling outlets of a third embodiment.

The direction to be designated as the main scanning direction is not particularly limited. However, the B direction was set as the main scanning direction and the A direction was set as the sub scanning direction in the present embodiment. The resolution in the A direction was adjusted by the angle of rotation of the head, and the resolution in the B direction was adjusted by scanning speed at a predetermined expulsion frequency, to set the resolution in the A direction to 80 dpi, and the resolution in the B direction to 322 dpi. That is, the resolution in the A direction was set to be smaller than the resolution in the B direction. Note that the effective interval among ink expelling outlets was 79 µm (FIG. 16A).

The coating time is determined by the number of scanning operations, stage feeding time, etc. In the present embodiment, the coating time required to coat the droplets was designated as T.

Under the conditions described above, the droplets were arranged within a straight line transfer region according to the droplet arrangement pattern.

[Embodiment 4]

Figure 16B:
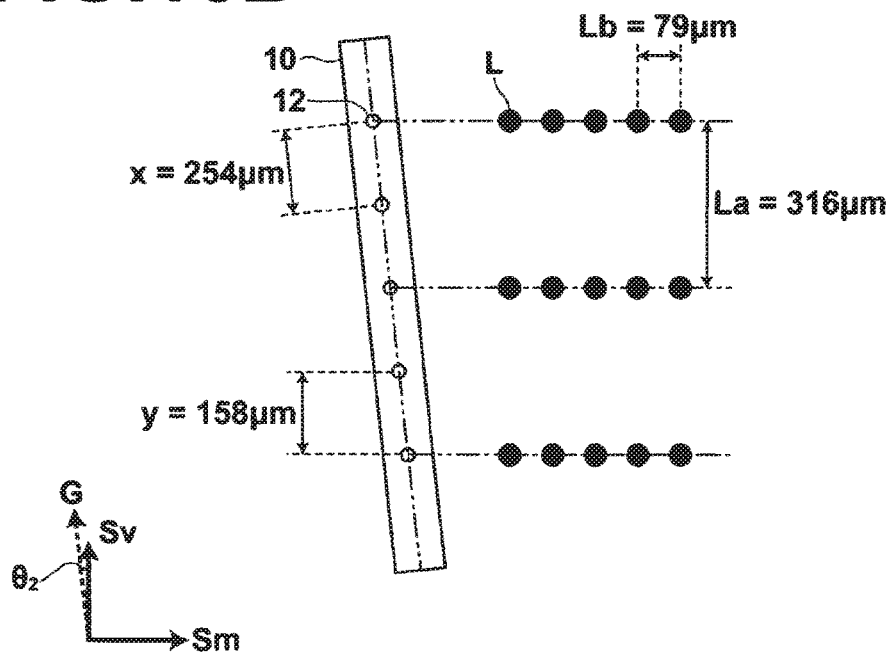
FIG. 16B is a schematic diagram for explaining the relationship among the intervals among lattice points along a sub scanning direction, the arrangement interval among ink expelling outlets, and effective intervals among ink expelling outlets of a fourth embodiment.

Droplets were arranged in the same manner as in Embodiment 3, except that an ink jet head was rotated for an angle $\theta_2$ to adjust the effective interval among ink expelling outlets to 158 µm (FIG. 16B).

COMPARATIVE EXAMPLE 3

Droplets were arranged in the same manner as in Embodiment 3, except that the resolution in the A direction was set to 322 dpi by a conventional method to match the resolution in the B direction of 322 dpi.

(Evaluation Results of Embodiments 3 and 4)

As illustrated in Table 2, the time required to coat droplets was shortened to ¼ that of a conventional method in Embodiment 3, and to ⅛ that of a conventional method in Embodiment 4. As a result, it was confirmed that the present invention realizes improvement of throughput during droplet discharge, while maintaining the resolution performance of the ink jet printer as a whole.

TABLE 2

| | Intervals Among Lattice Points (µm) | | Ink Jet Resolution (dpi) | | Effective Intervals Among Ink Expelling Outlets (µm) | Coating Time |
|---|---|---|---|---|---|---|
| | La | Lb | A Direction | B Direction | | |
| Embodiment 3 | 316 | 79 | 80 | 322 | 79 | T |
| Comparative Example 3 | 316 | 79 | 322 | 322 | 79 | 4T |
| Embodiment 4 | 316 | 79 | 80 | 322 | 158 | 0.5T |

The invention claimed is:

1. A nanoimprinting method, comprising:
coating a plurality of standard droplets of resist material at a standard amount onto a test substrate by an ink jet method;
pressing a test mold having a linear pattern of protrusions and recesses arranged in lines extending along a first direction against a surface of the test substrate which has been coated with the standard droplets, the pressing of the test mold onto the test substrate causing the standard droplets to spread to a degree that the standard droplets contact each other and causing shapes of the thus-spread standard droplets to be ellipses;
measuring two dimensional shapes of the ellipses by one of an optical method and a stylus method;
obtaining a two dimensional arrangement with the two dimensionally shaped ellipses being closely packed with the ellipses covering at least 70% of a two-dimensional image area;
extracting center coordinates of the ellipses which are arranged in the closely-packed two dimensional arrangement;
from the extracted center coordinates of the ellipses, obtaining a droplet arrangement pattern having the extracted center coordinates as lattice points that correspond to positions at which the plurality of droplets are to be arranged where the centers of each of the ellipses are lattice points in the obtained droplet arrangement pattern,
wherein, in the obtained droplet arrangement pattern, the lattice points define lines that extend in said first direction of the lines of the linear pattern of protrusions and recesses, and an average space (Wa) between centers of the droplets in an A direction substantially parallel to the first direction of the lines of the linear pattern of protrusions and recesses are longer than an average space (Wb) among droplets in a B direction substantially perpendicular to the A direction (Wa>Wb);
using the obtained droplet arrangement pattern, coating a surface of a further substrate with further droplets of resist material by the ink jet method; and
pressing a linear pattern of protrusions and recesses of a further mold onto the surface of the further substrate which has been coated with the further droplets according to the obtained droplet arrangement pattern to spread the further droplets on the further substrate to form a further resist film constituted by bonds among the spread further droplets and to transfer the linear pattern of protrusions and recesses of the further mold onto the resist film, wherein when coating the further droplets on the further substrate, the further droplets are coated within a first line transfer region of the further substrate that faces the linear pattern of protrusions and recesses of the further mold when the linear pattern of protrusions is pressed against the further substrate.

2. The nanoimprinting method as defined in claim 1, wherein:
a ratio Wa/Wb between the average space Wa between droplets in the A direction and the average space Wb between droplets in the B direction satisfies the following formula (1)

$$1.8 \leq Wa/Wb \leq 0.52 V^{1/3}/d \qquad (1)$$

wherein V represents the average volume of each coated droplet, and d represents the average thickness of the resist film.

3. The nanoimprinting method as defined in claim 1, wherein:
the resolution in the A direction which is defined by an ink jet head that performs the coating with the droplets is set to be lower than the resolution in the B direction which is defined by the ink jet head.

4. The nanoimprinting method as defined in claim 2, wherein:
the resolution in the A direction which is defined by an ink jet head that performs the coating with the droplets is set to be lower than the resolution in the B direction which is defined by the ink jet head.

5. The nanoimprinting method as defined in claim 3, wherein:
one of the A direction and the B direction is set as a main scanning direction in the ink jet method, and the other is set as a sub scanning direction in the ink jet method; and
the ink jet head is set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged.

6. The nanoimprinting method as defined in claim 4, wherein:
one of the A direction and the B direction is set as a main scanning direction in the ink jet method, and the other is set as a sub scanning direction in the ink jet method; and
the ink jet head is set such that the intervals among lattice points along the sub scanning direction is an integer multiple of effective intervals among ink expelling outlets of the ink jet head along the sub scanning direction, when coating the droplets according to a droplet arrangement pattern constituted by a plurality of lattice points that correspond to positions at which each of the plurality of droplets are to be arranged.

* * * * *